United States Patent
Ishii et al.

(10) Patent No.: US 8,906,738 B2
(45) Date of Patent: Dec. 9, 2014

(54) OXIDE SEMICONDUCTOR THIN FILM TRANSISTOR WITH AN ALUMINUM OXIDE PROTECTIVE FILM MADE USING A CONTINUOUS DEPOSITION PROCESS OF ALUMINUM OXIDE LAMINATED WITH AN ALUMINUM FILM

(75) Inventors: Takahide Ishii, Tokyo (JP); Yoshihiro Oshima, Tokyo (JP)

(73) Assignee: Sony Corporation (JP)

( * ) Notice: Subject to any disclaimer, the term of this patent is extended or adjusted under 35 U.S.C. 154(b) by 255 days.

(21) Appl. No.: 13/280,628

(22) Filed: Oct. 25, 2011

(65) Prior Publication Data

US 2012/0112182 A1 May 10, 2012

(30) Foreign Application Priority Data

Nov. 5, 2010 (JP) ................................ 2010-248399

(51) Int. Cl.
| | |
|---|---|
| H01L 21/00 | (2006.01) |
| H01L 21/16 | (2006.01) |
| H01L 29/786 | (2006.01) |
| H01L 29/66 | (2006.01) |
| H01L 29/49 | (2006.01) |
| H01L 27/12 | (2006.01) |

(52) U.S. Cl.
CPC ...... *H01L 29/7869* (2013.01); *H01L 29/78606* (2013.01); *H01L 29/66742* (2013.01); *H01L 29/4908* (2013.01); *H01L 27/1225* (2013.01)
USPC 438/104; 257/43; 257/E21.412; 257/E33.053

(58) Field of Classification Search
CPC ................ H01L 29/78606; H01L 29/7869; H01L 29/4908; H01H 29/66742
USPC ............. 438/104; 257/43, E21.412, E33.053, 257/E21.421
See application file for complete search history.

(56) References Cited

U.S. PATENT DOCUMENTS

| | | | | |
|---|---|---|---|---|
| 8,173,487 | B2 * | 5/2012 | Urayama et al. | 438/104 |
| 8,216,879 | B2 * | 7/2012 | Kaji et al. | 438/104 |
| 2011/0201162 | A1 | 8/2011 | Hosono et al. | |

FOREIGN PATENT DOCUMENTS

| | | |
|---|---|---|
| JP | H11-181564 | 7/1999 |
| JP | 2000-138215 | 5/2000 |
| JP | 2004-319673 | 11/2004 |
| JP | 2005-033172 | 2/2005 |
| JP | 2007-194594 | 8/2007 |
| JP | 2010-135462 | 6/2010 |
| JP | 2010-135770 | 6/2010 |
| JP | 2010-205987 | 9/2010 |
| WO | WO2005088726 | 9/2005 |
| WO | WO 2010/041686 | 4/2010 |

OTHER PUBLICATIONS

Official Action (with English translation) for Japanese Patent Application No. 2010-248399 mailed Sep. 2, 2014, 8 pages.

* cited by examiner

*Primary Examiner* — Stephen W Smoot
*Assistant Examiner* — Vicki B Booker
(74) *Attorney, Agent, or Firm* — Sheridan Ross P.C.

(57) ABSTRACT

Disclosed herein is a method of manufacturing a thin film transistor having a structure that a gate electrode and an oxide semiconductor layer are disposed with a gate insulating film interposed between the gate electrode and the oxide semiconductor layer, and a source/drain electrode is electrically connected to the oxide semiconductor layer, the method including: continuously depositing an aluminum oxide ($Al_2O_3$) layer as a protective film and an aluminum (Al) layer in this order on any of the source/drain electrode, the gate insulating film, and the oxide semiconductor layer by using sputtering.

8 Claims, 22 Drawing Sheets

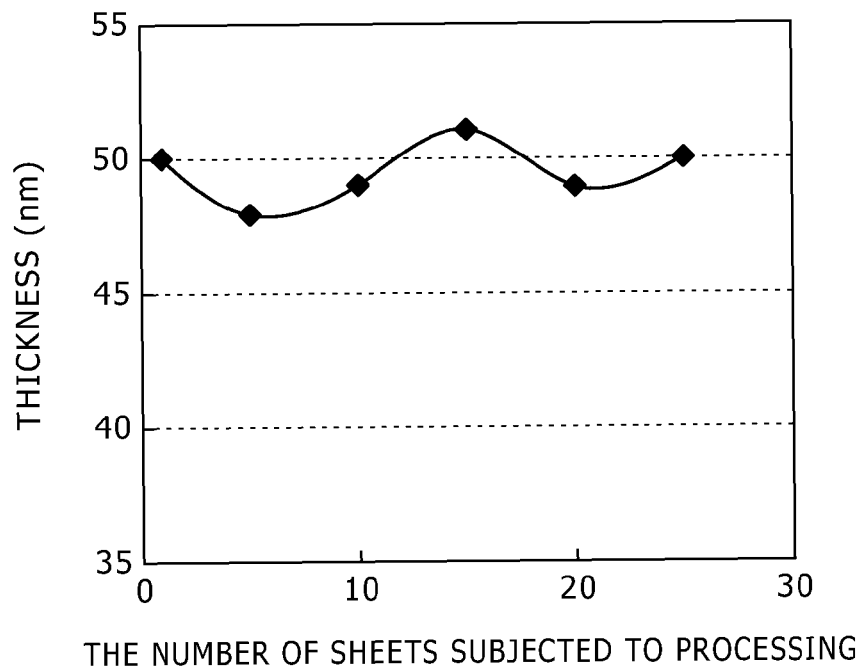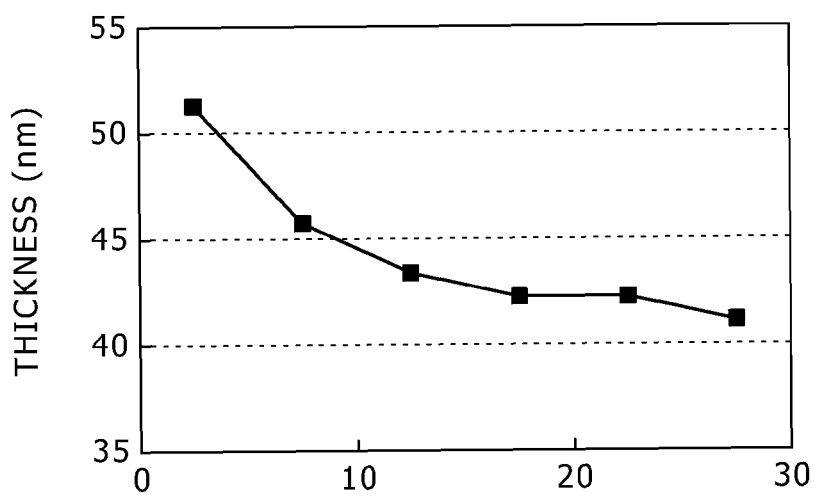

EXAMPLE

COMPARATIVE EXAMPLE (ANNEALING TREATMENT)

(ANNEALING TREATMENT)

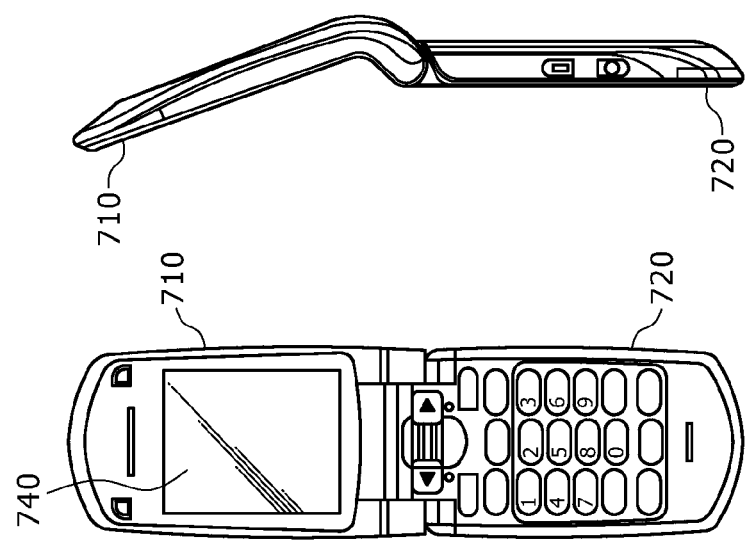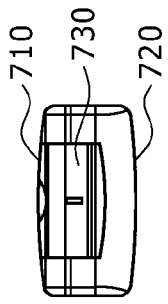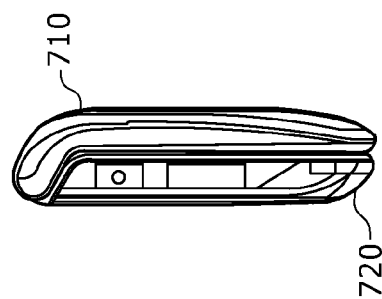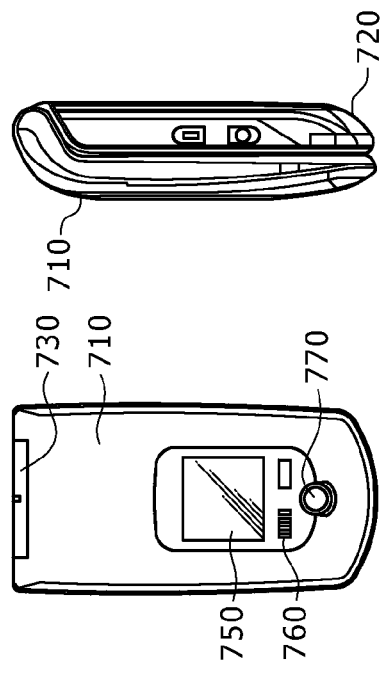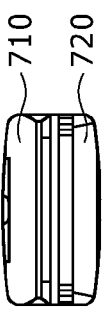

OXIDE SEMICONDUCTOR THIN FILM TRANSISTOR WITH AN ALUMINUM OXIDE PROTECTIVE FILM MADE USING A CONTINUOUS DEPOSITION PROCESS OF ALUMINUM OXIDE LAMINATED WITH AN ALUMINUM FILM

CROSS REFERENCES TO RELATED APPLICATIONS

The present application claims priority to Japanese Patent Application No. 2010-248399 filed on Nov. 5, 2010, the disclosure of which is incorporated herein by reference.

BACKGROUND

The present application relates to a Thin Film Transistor (TFT) used in a display device or the like, and a method of manufacturing the same.

In recent years, with a view to application of a Thin Film Transistor (TFT), a light emitting device, a transparent conductive film, and the like to electronic apparatuses, the research and development of oxide semiconductors such as a zinc oxide and an indium gallium zinc oxide are very active. It is found out that when the oxide semiconductor is used in an active layer (channel) of the TFT, the oxide semiconductor shows a high electron mobility, and thus shows excellent electrical characteristics as compared with the TFT using amorphous silicon. In addition, the oxide semiconductor has an advantage such that even at a low temperature close to a room temperature, the high mobility can be expected, and so forth, and thus the positive development of the oxide semiconductor is progressed. With regard to the TFT using such an oxide semiconductor layer, a bottom gate type structure, and a top gate type structure have been reported. The bottom gate type structure, and the top gate type structure, for example, are described in PCT Patent Publication No. WO 2005-088726 and Japanese Patent Laid-Open No. 2007-194594.

However, in the oxide semiconductor, a film quality is easy to deteriorate due to breakaway of oxygen, mixing of hydrogen, and the like. This results in that in the TFT, a threshold voltage is shifted to a minus side, the current-voltage characteristics and the like are deteriorated, and so forth.

In order to cope with such a situation, a technique for forming a protective film made of an aluminum oxide ($Al_2O_3$) or the like as a protective film for an oxide semiconductor layer becoming a channel has been proposed. This technique, for example, is described in Japanese Patent Laid-Open No. 2010-135462. Such a protective film, for example, can be deposited in an atmospheric ambient of a mixed gas of oxygen ($O_2$) and argon (Ar) with aluminum as a target by, for example, utilizing a reactive sputtering method.

SUMMARY

However, the reactive sputtering method as described above involves a drawback that along with accumulation of the number of times of processing (the number of sheets), and a change in an applied voltage (power), a surface of aluminum as the target metamorphoses. For this reason, a thickness of an aluminum oxide film thus formed is changed, a damage (deterioration of a film quality such as a refractive index) is caused, and the degree thereof is dispersed every processing. In particular, in the sputtering using a target having a large area like magnetron sputtering, although the sputtering is desirable from a viewpoint of productivity, it is easy to cause the change in the film quality of the aluminum oxide due to the metamorphosing of the surface of the target as described above. Also, such a change in the film quality of the protective film becomes a factor for causing the dispersion in the TFT characteristics such as the threshold voltage and the current-voltage characteristics during the mass production of the TFTs. For this reason, it is desired to reduce the dispersion in the TFT characteristics due to the change in the film quality of the protective film as described above.

The present disclosure has been made in order to solve the problem described above, and it is therefore desirable to provide a method of manufacturing a thin film transistor which is capable of reducing a dispersion in TFT characteristics due to a change in a film quality of a protective film (made of $Al_2O_3$), and the thin film transistor.

In order to attain the desire described above, according to an embodiment, there is provided a method of manufacturing a thin film transistor having a structure that a gate electrode and an oxide semiconductor layer are disposed with a gate insulating film interposed therebetween, and a source/drain electrode is electrically connected to the oxide semiconductor layer, the method including: continuously depositing an aluminum oxide ($Al_2O_3$) layer as a protective film and an aluminum (Al) layer in this order on any of the source/drain electrode, the gate insulating film, and the oxide semiconductor layer by using sputtering.

In the method of manufacturing the thin film transistor according to the embodiment, the aluminum oxide layer as the protective film, and the aluminum layer are continuously deposited in this order on any of the source/drain electrode, the gate insulating film, and the oxide semiconductor layer by using the sputtering. At this time, in any of the sputtering processes for the aluminum oxide layer and the aluminum layer, for example, aluminum is used as the target. However, in a phase of the deposition of the aluminum oxide layer, an oxygen gas is used as a reaction gas, while in a phase of the deposition of the aluminum layer, no oxygen gas is used. Here, although in the process for the deposition of the aluminum oxide layer, the surface of the target is easy to metamorphose due to the oxygen gas, thereafter, the aluminum layer is deposited (the sputtering not using the oxygen gas is carried out) so as to follow the deposition of the aluminum oxide layer, thereby modifying the surface of the target. Normally, the target is used in the deposition processing for the aluminum oxide layer plural times. However, the continuous deposition as described above is carried out, which results in that the surface of the target is modified every deposition processing. Therefore, even when the number of times of the deposition processing is increased, the thickness and the refractive index in the aluminum oxide layer are hard to change (the reproducibility of the deposition of the protective film is enhanced).

According to another embodiment, there is provided a thin film transistor having a structure that a gate electrode and an oxide semiconductor layer are disposed with a gate insulating film interposed therebetween, and a source/drain electrode is electrically connected to the oxide semiconductor layer, in which a lamination film having an aluminum oxide ($Al_2O_3$) layer as a protective film, and an aluminum (Al) layer in this order is provided either on the oxide semiconductor layer or on the gate insulating film.

In the thin film transistor according to the another embodiment, the lamination film having the aluminum oxide layer as the protective film, and the aluminum layer in this order is provided either on the gate insulating film or on the oxide semiconductor layer. As a result, the thickness and the refractive index in the deposition process are hard to change (the reproducibility of the deposition of the protective film is enhanced).

As set forth hereinabove, according to the present disclosure, the aluminum oxide layer as the protective film, and the aluminum layer are continuously deposited in this order on any of the source/drain electrode, the gate insulating film, and the oxide semiconductor layer by using the sputtering. As a result, the surface of the target which has been metamorphosed in the process for the deposition of the aluminum oxide layer can be modified in the subsequent process for the deposition of the aluminum oxide. Therefore, even when the number of times of the deposition processing is increased, it is possible to suppress the change in the thickness, and the change in the film quality such as the refractive index in the protective film. As a result, the stable protection performance can be displayed for the oxide semiconductor layer, and thus it is possible to suppress the causing of the dispersion in the threshold voltage and the current-voltage characteristics every individual. Therefore, it becomes possible to reduce the dispersion in the TFT characteristics due to the change in the film quality of the protective film ($Al_2O_3$).

In addition, according to the present disclosure, the lamination film having the aluminum oxide layer as the protective film, and the aluminum layer in this order is provided either on the gate insulating film or on the oxide semiconductor layer. Therefore, it is possible to suppress the change in the thickness and refractive index of the aluminum oxide layer in the deposition process. As a result, the stable protection performance can be displayed for the oxide semiconductor layer, and thus it is possible to suppress the causing of the dispersion in the threshold voltage and the current-voltage characteristics every individual. Therefore, it becomes possible to reduce the dispersion in the TFT characteristics due to the change in the film quality of the protective film ($Al_2O_3$).

Additional features and advantages are described herein, and will be apparent from the following Detailed Description and the figures.

BRIEF DESCRIPTION OF THE FIGURES

FIGS. 3A and 3B are respectively a graph of a characteristic curve representing a change in a thickness of a protective film in Example, and a graph of a characteristic curve representing a change in a thickness of a protective film in Comparative Example.

FIGS. 19A to 19G are respectively a front view of a mobile phone as a fifth example of application, in an open state, to which the display device shown in FIG. 12 is applied, a side elevational view thereof in the open state, a front view thereof in a close state, a left side elevational view thereof in the close state, a right side elevational view thereof in the close state, a top plan view thereof, and a bottom view thereof in the close state.

DETAILED DESCRIPTION

Embodiments of the present application will be described below in detail with reference to the drawings.

1. First Embodiment (the case of a TFT in which an Al layer is removed after formation of a lamination film ($Al_2O_3$ layer/Al layer) in a bottom gate structure).

2. Second Embodiment (the case of a TFT in which an Al layer of a lamination film ($Al_2O_3$ layer/Al layer) is utilized as a gate electrode in a top gate structure).

3. Third Embodiment (the case of a TFT in which an Al layer of a lamination film ($Al_2O_3$ layer/Al layer) is utilized as a wiring layer in the bottom gate structure).

4. Display Device (an entire circuit configuration and a pixel circuit).

5. Application Examples (a module and electronic apparatuses).

1. First Embodiment

Structure of TFT 1

Figure 1:
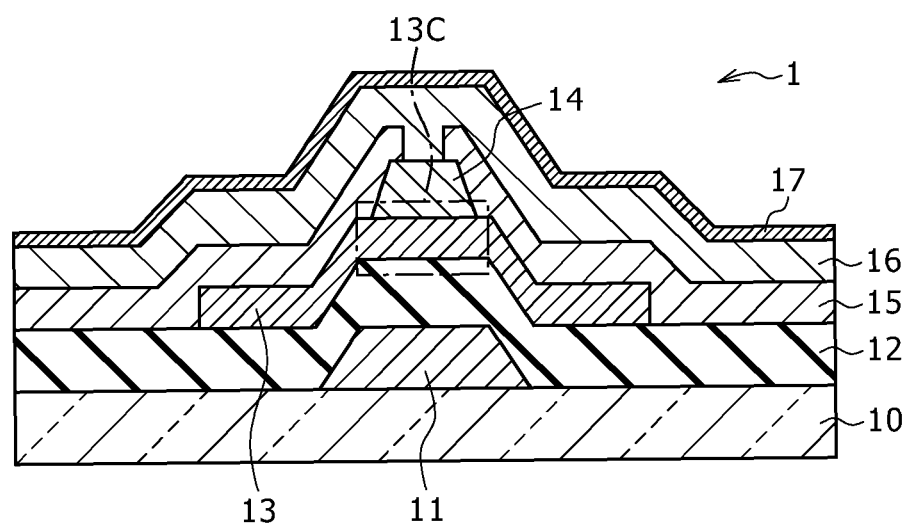
FIG. 1 is a cross sectional view showing a cross sectional structure of a TFT according to a first embodiment.

FIG. 1 is a cross sectional view showing a cross sectional structure of a TFT according to a first embodiment. The TFT 1, for example, is used as a drive element in an active matrix type organic EL display or liquid crystal display device. The TFT 1 is structured in such a way that a gate electrode 11 and an oxide semiconductor layer 13 are disposed with a gate insulating film 12 interposed therebetween so as to face each other, and a source/drain electrode 15 is provided so as to be electrically connected to the oxide semiconductor layer 13. In this case, the TFT 1 has a so-called bottom gate structure (reverse staggered structure). The TFT 1 includes the gate electrode 11 in a selective area on a substrate 10, for example, made of a glass, and has the gate insulating film 12 over the entire surface of the substrate 10 so as to cover the gate electrode 11. The oxide semiconductor layer 13 is formed in a selective area (an area facing the gate electrode 11) on the gate insulating film 12. A stopper layer 14 is disposed right above an area becoming a channel 13C in the oxide semiconductor layer 13. Also, the source/drain electrode 15 is provided so as to cover both of the stopper layer 14 and the oxide semiconductor layer 13. A first protective film (one protective film) 16 and a second protective film (the other protective film) 17 are formed in this order on the source/drain electrode 15 over the entire surface of the substrate 10.

The gate electrode 11 has a function of controlling a density of carriers in the oxide semiconductor layer 13 in accordance with a gate voltage (Vg) applied to the TFT 1, and also has a function as a wiring through which a predetermined electric potential is supplied. The gate electrode 11, for example, is an elementary substance made of one kind of metal selected from molybdenum (Mo), aluminum (Al), silver (Ag), and copper (Cu), an alloy thereof or a lamination film made of two or more kinds of metals selected from molybdenum (Mo), aluminum (Al), silver (Ag), and copper (Cu). An alloy (AlNd alloy) of aluminum and neodymium (Nd), for example, is given as an aluminum alloy. The gate electrode 11 may be composed of a transparent conductive film such as an ITO (indium tin oxide), an AZO (aluminum-doped zinc oxide), or a GZO (gallium-doped zinc oxide).

The gate insulating film 12, for example, is either a single layer film composed of one kind of film selected from a silicon oxide ($SiO_2$) film, a silicon nitride (SiN) film, and a silicon oxynitride (SiON) film, or a lamination film composed of two or more kinds of films selected from a silicon oxide ($SiO_2$) film, a silicon nitride (SiN) film, and a silicon oxynitride (SiON) film.

The oxide semiconductor layer 13 forms the channel 13C by application of the gate voltage to the gate electrode 11, and, for example, is made of an oxide semiconductor containing therein at least one kind of metal selected from indium (In), gallium (Ga), and zinc (Zn). An indium gallium zinc oxide (IGZO, InGaZnO), for example, is given as such an oxide semiconductor. A thickness of the oxide semiconductor layer 13, for example, is in the range of 20 to 100 nm.

The stopper layer 14, for example, is either a single layer film composed of one kind of film selected from a silicon oxide film, a silicon nitride film, and a silicon oxynitride film, or a lamination film composed of two or more kinds of films selected from a silicon oxide film, a silicon nitride film, and a silicon oxynitride film. The stopper layer 14, for example, has a function of preventing a damage of the channel 13C in the oxide semiconductor layer 13 in a phase of formation of the source/drain electrode 15.

The source/drain electrode 15 is separated into two parts in an area corresponding to the channel 13C of the oxide semiconductor layer 13. One of the two parts functions as a source electrode, and the other thereof functions as a drain electrode. The metals or the transparent conductive films which are identical to those enumerated in the gate electrode 11 described above are given as a material composing the source/drain electrode 15.

The first protective film 16 is made of an aluminum oxide ($Al_2O_3$), and functions as a protective film (passivation film) for the oxide semiconductor layer 13. Specifically, the first protective film 16 suppresses the commingling of an outside air (such as hydrogen) with the oxide semiconductor layer 13. The first protective film 16 also has a function of storing oxygen atoms, and supplying the oxygen atoms to the oxide semiconductor layer 13 in manufacturing processes. Specifically, although details will be described later, in a phase of the film deposition, the oxygen atoms are stored (excessively stored) in the first protective film 16. The oxygen atoms thus stored are then supplied to the oxide semiconductor layer 13 in a subsequent annealing treatment. It is found out that the supply of such oxygen atoms contributes to the recovery and deterioration prevention of the characteristics of the oxide semiconductor layer 13, thereby making it possible to realize the recovery and deterioration prevention of the TFT characteristics. A thickness of the first protective film 16, for example, is in the range of 20 to 100 nm.

The second protective film 17 is made of an aluminum oxide having a low oxygen concentration, and is formed in a lamination film forming process which will be described later. A thickness of the second protective film 17, for example, is in the range of 1 to 5 nm.

[Method of Manufacturing TFT 1]

FIGS. 2A to 2I are respectively cross sectional views explaining a method of manufacturing the TFT 1. The TFT 1, for example, can be manufacturing as follows.

Figure 2A:
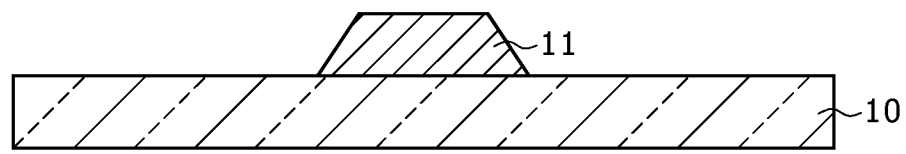
FIGS. 2A to 2I are respectively cross sectional views showing process for manufacturing the TFT shown in FIG. 1.

Firstly, as shown in FIG. 2A, the material described above, for example, molybdenum is deposited over the entire surface of the substrate 10 by, for example, utilizing a sputtering method. After that, the material layer thus deposited is patterned by, for example, utilizing a photolithography method, thereby forming the gate electrode 11 in the selective area on the substrate 10.

Figure 2B:
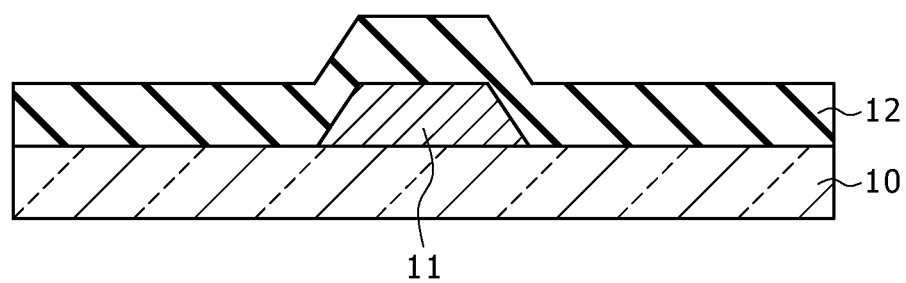

Subsequently, as shown in FIG. 2B, the gate insulating film 12 is formed over the entire surface of the substrate 10 having the gate electrode 11 formed thereon by, for example, utilizing a Chemical Vapor Deposition (CVD) method. In this case, with regard to a raw material gas, a mixed gas containing therein silane ($SiH_4$), ammonia ($NH_3$), and nitrogen is used when a silicon nitride film is formed as the gate insulating film 12. On the other hand, a mixed gas containing therein silane and dinitrogen monoxide ($N_2O$) is used when a silicon oxide film is formed as the gate insulating film 12.

Figure 2C:
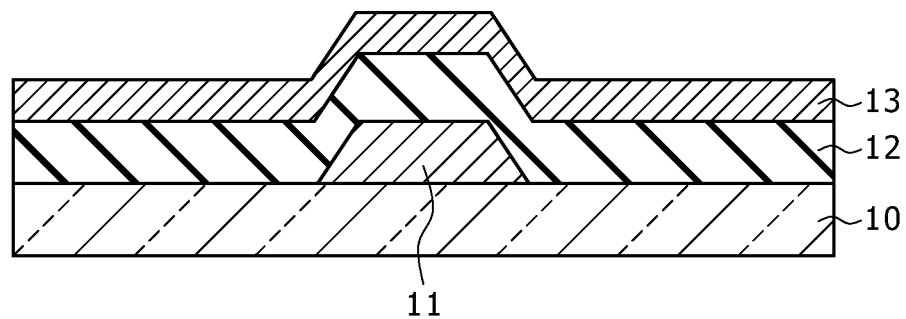

Next, as shown in FIG. 2C, the oxide semiconductor layer 13 is deposited by, for example, utilizing the sputtering method. Specifically, when an IGZO is used as the material of the oxide semiconductor layer 13, reactive sputtering is carried out with ceramics of the IGZO as a target. In this case, for example, in a D.C. sputtering system, a chamber is degassed until a predetermined degree of vacuum is obtained. After that, the target and the substrate 10 are arranged and, for example, a mixed gas of argon (Ar) and oxygen ($O_2$) is introduced into the chamber, and under this condition, plasma discharge is caused in the chamber. As a result, the oxide semiconductor layer 13 made of the IGZO is deposited on the gate insulating film 12.

Figure 2D:
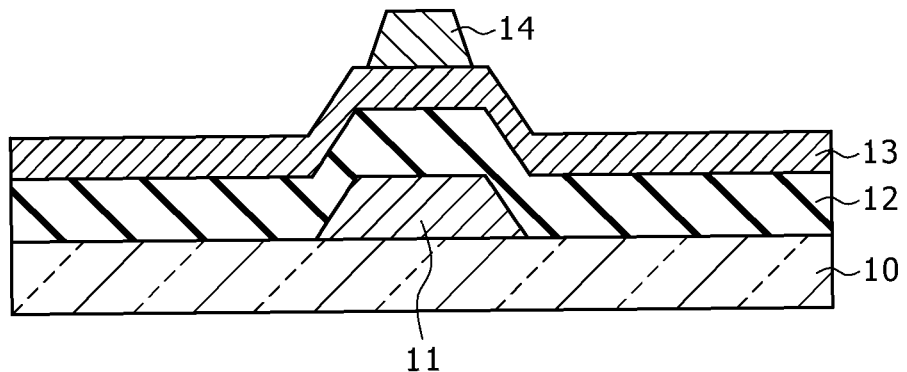

After that, as shown in FIG. 2D, a layer becoming the stopper layer 14 made of the material described above is deposited by, for example, utilizing the CVD method, and is then patterned into a desired shape of the stopper layer 14 by, for example, utilizing a dry etching method using the photolithography method.

Figure 2E:
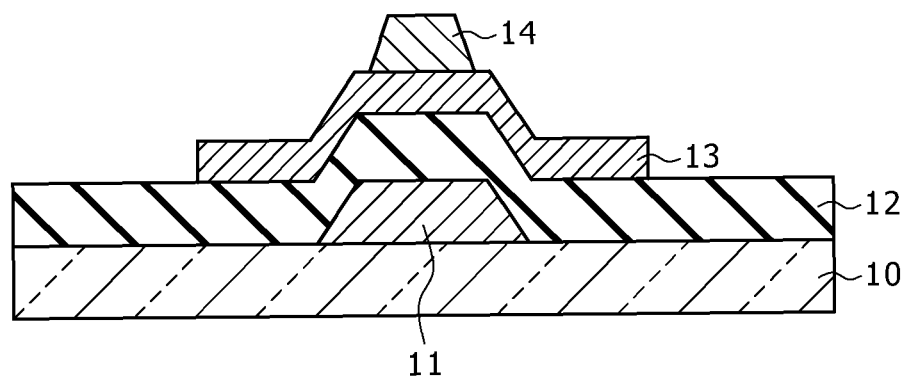

Subsequently, as shown in FIG. 2E, the oxide semiconductor layer 13 is patterned into a desired shape in the selective area facing the gate electrode 11 by, for example, utilizing a wet etching method using the photolithography method.

Figure 2F:
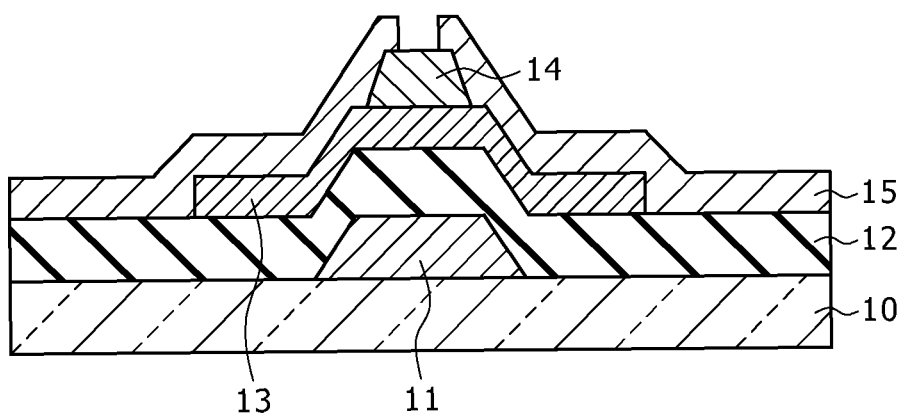

Next, as shown in FIG. 2F, the materials described above, for example, molybdenum, aluminum, and molybdenum are deposited in this order so as to cover both of the oxide semiconductor layer 13 and the stopper layer 14 by, for example, utilizing the sputtering method, thereby depositing a layer becoming the source/drain electrode 15. After that, an opening (source/drain separation trench) is formed right above the channel 13C in the layer becoming the source/drain electrode 15 thus deposited, and the layer is patterned into a desired shape of the source/drain electrode 15 by, for example, utilizing either the wet etching or dry etching using the photolithography method. It is noted that in this case, since the stopper layer 14 is provided on the oxide semiconductor layer 13, the channel 13C can be prevented from being damaged.

(Formation of First Protective Film 16)

Subsequently, the first protective film 16 is formed. Specifically, after the lamination film (composed of the aluminum oxide layer and the aluminum layer) is formed, the first protective film 16 made of an aluminum oxide is formed by removing the aluminum layer.

(1. Lamination Film Forming Process)

Figure 2G:
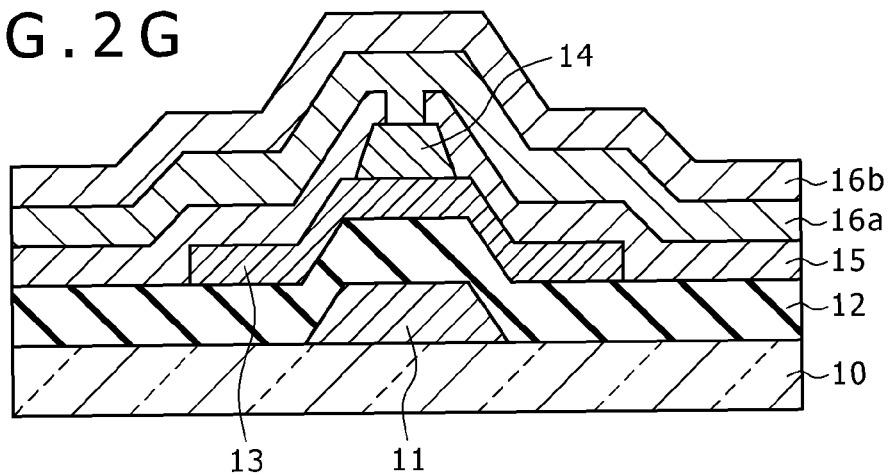

That is to say, firstly, as shown in FIG. 2G, an $Al_2O_3$ layer 16a (corresponding to the first protective film 16) and an Al layer 16b made of pure aluminum are continuously deposited over the entire surface of the substrate 10 by utilizing the sputtering method. In this case, in a first stage step (first step) of depositing the $Al_2O_3$ layer 16a, and in a second stage step (second step) of depositing the Al layer 16b, the sputtering is carried out while the substrate 10 is held within the same chamber. However, the same aluminum is used as the target and an atmospheric ambient gas is adjusted every step.

Specifically, in the first stage step, aluminum as the target and the substrate 10 as the substrate on which the films are to be deposited are disposed within the chamber so as to face each other, and the sputtering is carried out while an oxygen gas is supplied together with a rare gas element such as argon to the chamber. As a result, a product ($Al_2O_3$) of a reaction between an aluminum atom sputtered from the surface of aluminum as the target and an oxygen supplied to the chamber is deposited on the substrate 10 (the $Al_2O_3$ layer 16a is deposited). In addition, a mass of oxygen atoms are stored in the $Al_2O_3$ layer 16a deposited in such a way.

After that, in the second stage step, after the chamber is degassed once, the sputtering is carried out without supplying the oxygen gas (with only the argon gas being introduced). At this time, with regard to the target, the aluminum target which was used in the first stage stop is continuously used as it is. In the second stage step, the aluminum atoms which have been sputtered from the surface of the aluminum target are deposited on the substrate 10 (the Al layer 16b is deposited). The sputtering in the second stage step is preferably carried out for a time or more until the surface of the target is modified into pure aluminum. By carrying out such sputtering, the $Al_2O_3$ layer 16a and the Al layer 16b are continuously deposited. It is noted that in this lamination film forming process, actually, in a process of transition from the reactive sputter for the deposition of the $Al_2O_3$ layer 16a to the sputter for the deposition of the Al layer 16b, the aluminum oxide film on the surface of the target is sputtered, which results in that an aluminum oxide film having a low-oxygen concentration is formed between the $Al_2O_3$ layer 16a and the Al layer 16b (this also applies to second and third embodiments). In the first embodiment, the aluminum oxide film having the low-oxygen concentration finally becomes the second protective film 17.

2. Al Layer Removing Process

Figure 2H:
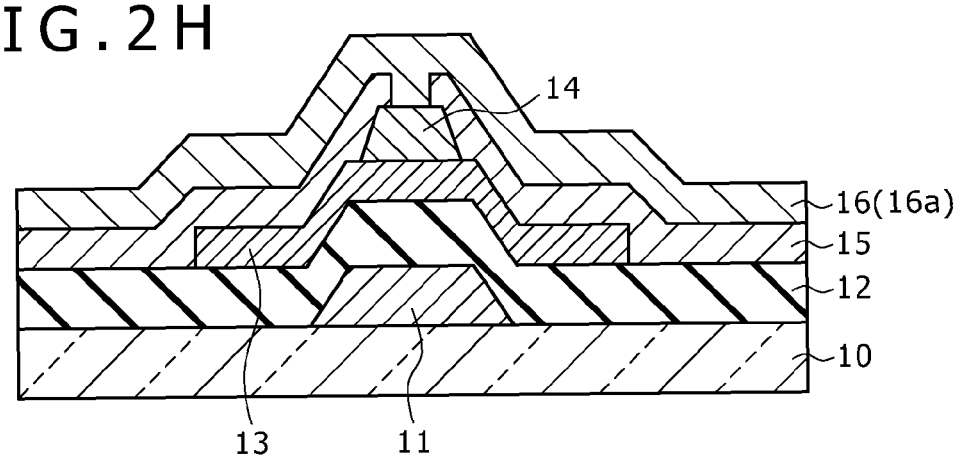

Subsequently, as shown in FIG. 2H, of the $Al_2O_3$ layer 16a and the Al layer 16b which have been continuously deposited in the manner as described above, the Al layer 16b is selectively removed away, thereby leaving the $Al_2O_3$ layer 16a as the first protective film 16. In this case, for example, the wet etching is carried out to the surface of the $Al_2O_3$ layer 16a, thereby removing the Al layer 16b from the entire surface of the substrate 10. As a result, the first protective film 16 is formed. In addition, although the aluminum oxide film having the low-oxygen concentration, as described above, is formed on the surface of the first protective film 16 in the lamination film forming process, that aluminum oxide film remains as the second protective film 17.

Figure 2I:
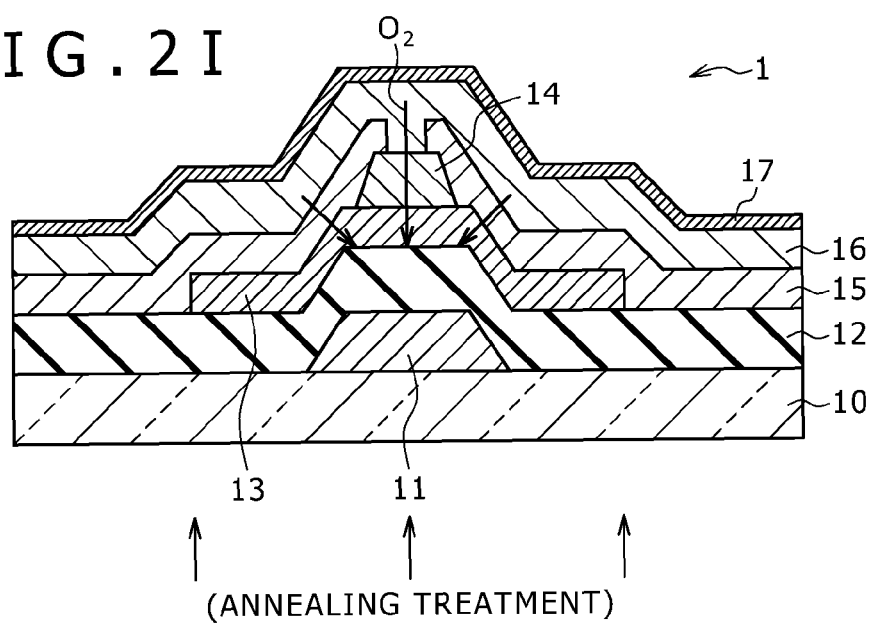

Finally, as shown in FIG. 2I, an annealing treatment is carried out for the entire substrate 10. In this case, the annealing treatment, for example, is carried out at a temperature of 200 to 300° C. for about 0.5 to about two hours in an atmospheric ambient containing therein either oxygen or nitrogen ($N_2$). As a result, the oxygen stored in the first protective film 16 is supplied to the oxide semiconductor layer 13, thereby realizing the recovery and deterioration prevention of the characteristics in the oxide semiconductor layer 13. With that, the TFT 1 shown in FIG. 1 is completed.

[Operation and Effects of TFT 1]

As described above, in the first embodiment, the processes for manufacturing the TFT 1 includes the lamination film forming process for continuously depositing the $Al_2O_3$ layer 16a as the first protective film 16 and the Al layer 16b on the source/drain electrode 15 by utilizing the sputtering method. Here, in the process for depositing the $Al_2O_3$ layer 16a (in the first stage step), the surface of the target is easy to metamorphose due to the oxygen gas used in the reaction. After that, however, the Al layer 16b is continuously deposited (the sputtering not using oxygen is carried out), thereby modifying the surface of the target. Although the target is normally used in the processing for depositing the $Al_2O_3$ layer 16a plural times, the continuous deposition as described above is carried out, which results in that the surface of the target is modified whenever the deposition processing is carried out. Therefore, even when the number of times of the deposition processing is increased, the thickness and the film quality (such as the density and the refractive index) in the $Al_2O_3$ layer 16a are hard to change. That is to say, the reproducibility of the film quality of the $Al_2O_3$ layer 16a is enhanced, and thus the protective film can be stably formed.

Figure 4A:
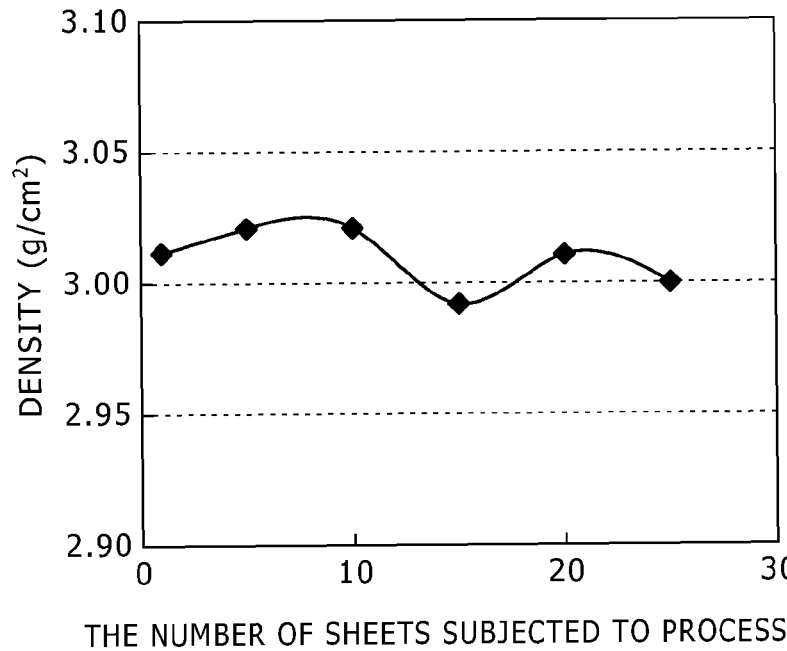
FIGS. 4A and 4B are respectively a graph of a characteristic curve representing a change in a density of the protective film in Example, and a graph of a characteristic curve representing a change in a density of the protective film in Comparative Example.
Figure 4B:
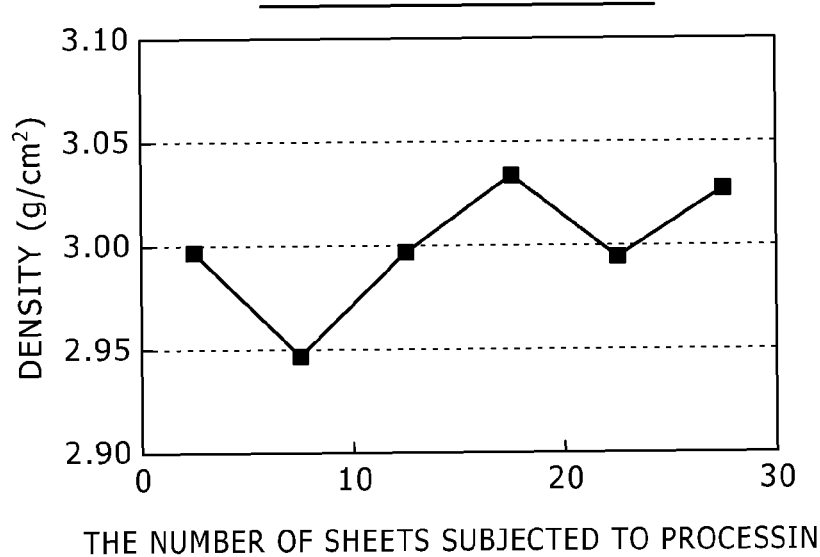
Figure 5A:
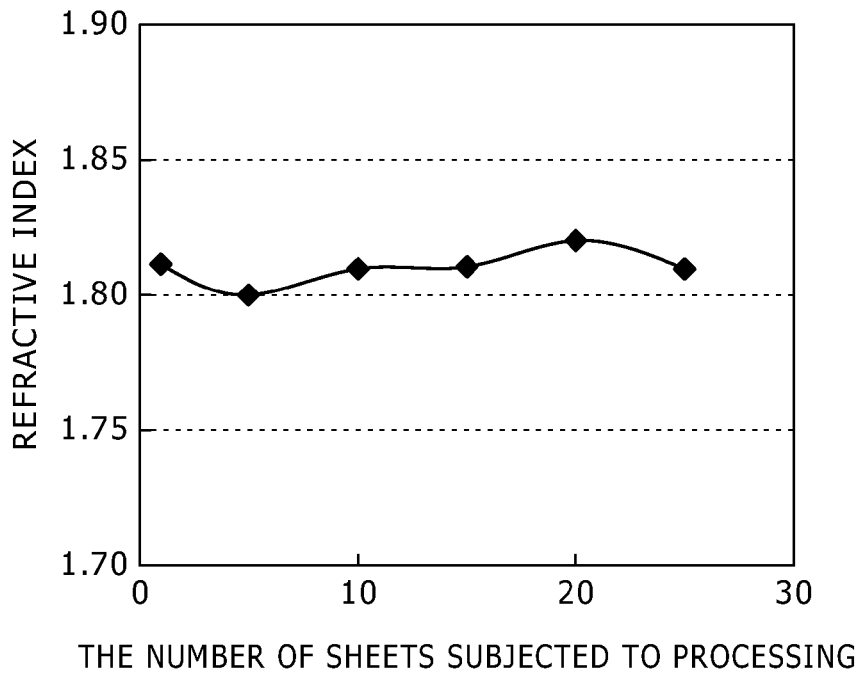
FIGS. 5A and 5B are respectively a graph of a characteristic curve representing a change in a refractive index of the protective film in Example, and a graph of a characteristic curve representing a change in a refractive index of the protective film in Comparative Example.
Figure 5B:
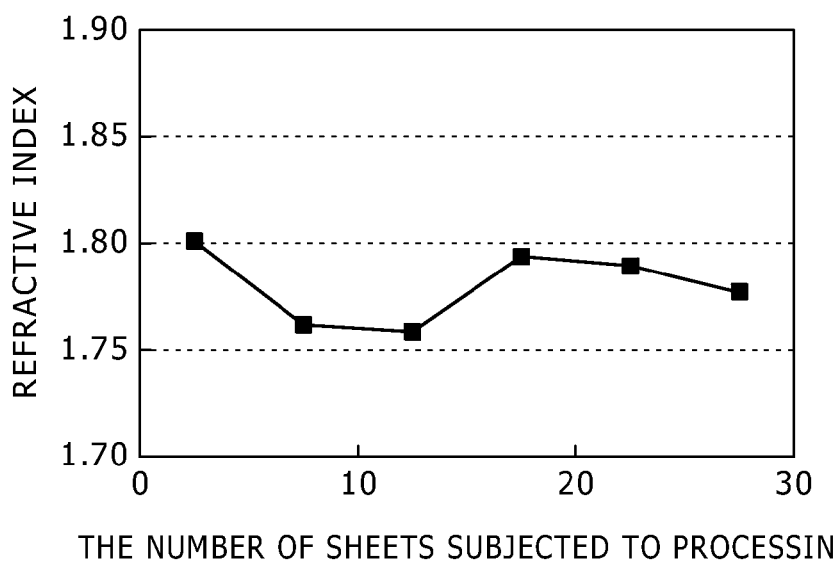

Here, there were measured a thickness change, a density change, and a refractive index change of the first protective film 16 (made of $Al_2O_3$) which had been formed as Example through the lamination film forming process as described above. In addition, there were also measured a thickness change, a density change, and a refractive index change of a protective film formed as Comparative Example for Example without through the lamination film forming process described above (that is, an $Al_2O_3$ film deposited as a single layer). FIGS. 3A, 4A, and 5A show a thickness change, a density change, and a refractive index change in Example, respectively. Also, FIGS. 3B, 4B, and 5B show a thickness change, a density change, and a refractive index change in Comparative Example, respectively. It is noted that in the measurements described above, in the both cases of Example and Comparative Example, about 1 to about 30 sheets were supposed as the number of sheets subjected to the deposition processing (the number of times of the deposition processing). Thus, data on the thicknesses, data on the densities, and data on the refractive indices are plotted in FIGS. 3A and 3B, FIGS. 4A and 4B, and FIGS. 5A and 5B, respectively, every time point corresponding to the selective number of sheets subjected to the deposition processing. It is noted that the density (g/cm$^2$) described above represents the density of $Al_2O_3$ which was measured by using an X-ray.

As shown in FIGS. 3A and 3B, it is understood that Comparative Example has a tendency such that the thickness is decreased with an increase in the number of sheets subjected to the deposition processing. On the other hand, it is also understood that in Example, even when the number of sheets subjected to the deposition processing increases, the thickness remains within a given range of about 50 nm, and thus the change in the thickness is reduced as compared with the case of Comparative Example. In addition, as shown in FIGS. 4A and 4B, it is understood that in Comparative Example, the density differs every sheet subjected to the deposition processing and a large change (dispersion) is caused in the density, whereas in Example, the change in the density is reduced as compared with the case of Comparative Example. Moreover, as shown in FIGS. 5A and 5B, it is understood that in Comparative Example, the refractive index differs every sheet subjected to the deposition processing and a large change (dispersion) is caused in the refractive index, whereas in Example, the dispersion in the refractive index is reduced as compared with the case of Comparative Example.

Figure 6:
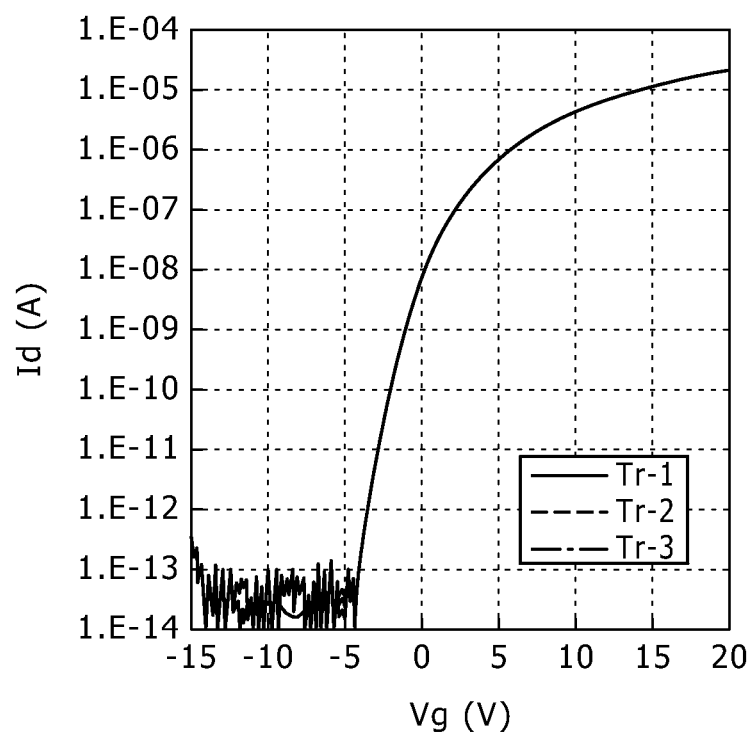
FIG. 6 is a graph of current-voltage characteristics in Example.

In addition, FIG. 6 shows a relationship (current-voltage characteristics) between a gate voltage Vg and a drive current Id with respect to three TFT samples: Tr1; Tr2; and Tr3 in Example described above. It is noted that the three samples were manufactured by carrying out the annealing processing at 250° C. for 0.5 hours in the atmosphere. As can be seen from FIG. 6, the dispersion is hardly caused in the TFT characteristics among the individuals.

As has been described so far, in the first embodiment, the $Al_2O_3$ layer 16a and the Al layer 16b are continuously deposited in this order on the source/drain electrode 15 by utilizing the sputtering method. As a result, the surface of the target metamorphosed in the process for depositing the $Al_2O_3$ layer 16a can be modified in the subsequent process for depositing the Al layer 16b. Therefore, even when the number of times of the deposition processing is increased, it is possible to suppress the change in the thickness, and the change in the film quality in the protective film. As a result, the stable protection performance can be displayed for the oxide semiconductor layer 13, and thus it is possible to suppress the causing of the dispersion in the threshold voltage and the current-voltage characteristics every individual. Therefore, it becomes possible to reduce the dispersion in the TFT characteristics due to the change in the film quality of the protective film (made of $Al_2O_3$). As a result, both of the productivity and the reliability are also enhanced.

It is noted that when the TFT 1 of the first embodiment, for example, is formed as a drive element in an organic EL display device, it is only necessary that after the TFT 1 is formed on the substrate 10 as a driving substrate through the manufacturing processes described above, the following processes are further carried out. That is to say, although an illustration is omitted here, after the second protective film 17 is formed, both of the first protective film 16 and the second protective film 17 are patterned. Subsequently, after a planarizing film, for example, made of polyimide is formed over the entire surface of the substrate 10, a contact hole is formed in the planarizing film so as to extend to a surface of the source/drain electrode 15. An anode electrode (lower reflecting electrode), for example, made of an alloy (AlNd alloy) of aluminum and neodymium is formed so as to be fitted in the contact hole. After that, an inter-pixel insulating film (window film) having an opening so as to correspond to the anode electrode is deposited, and an organic layer having a light emission layer is formed in the opening portion. Although an illustration is omitted here, after formation of the organic layer, a cathode electrode (upper electrode) is formed, and an encapsulating substrate having a color filter and the like formed thereon is stuck to the counter substrate described above through an adhesive layer. As a result, the organic EL display device can be manufactured.

2. Second Embodiment

Structure of TFT 2

Figure 7:
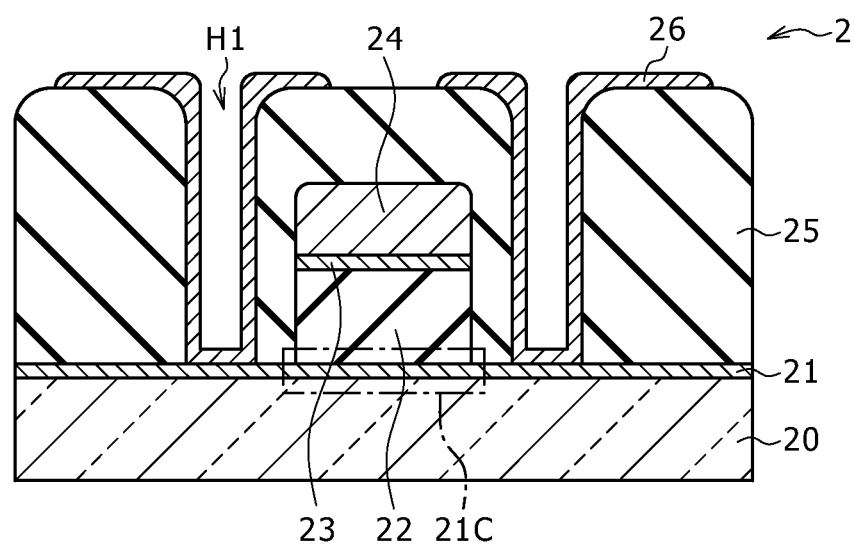
FIG. 7 is a cross sectional view showing a cross sectional structure of a TFT according to a second embodiment.

FIG. 7 shows a cross sectional structure of a TFT (TFT 2) according to a second embodiment. The TFT 2, for example, is used as the drive element of the active matrix type organic EL display device or the like similarly to the case of the TFT 1 of the first embodiment described above. In addition, similarly to the case of the TFT 1, the TFT 2 is structured in such a way that a gate electrode 24 and an oxide semiconductor layer 21 are disposed with a gate insulating film 22 interposed therebetween so as to face each other, and a source/drain electrode 26 is provided so as to be electrically connected to the oxide semiconductor layer 21. In addition, the TFT 2 has a protective film 23 which is deposited through the lamination film forming process as described above.

However, in the second embodiment, the TFT 2 has a so-called top gate structure (staggered structure). The TFT 2 includes an oxide semiconductor layer 21 on a substrate 20, for example, made of a glass. Also, the gate insulating film 22, the protective film 23 (made of $Al_2O_3$), and the gate electrode 24 (made of Al) are laminated in this order in a selective area (an area corresponding to a channel 21C) on the oxide semiconductor layer 21. An interlayer insulating film 25 is provided over the entire surface of the substrate 20 so as to cover all of the gate insulating film 22, the protective film 23, and the gate electrode 24. The interlayer insulating film 25 has a contact hole H1 which extends to a surface of the oxide semiconductor layer 21. A source/drain electrode 26 is provided on the interlayer insulating film 25 so as to be filled in the contact hole H1. In the following description, the same constituent elements as those in the first embodiment are designated by the same reference numerals or symbols, respectively, and a description thereof is suitably omitted here for the sake of simplicity.

The oxide semiconductor layer 21 forms the channel 21C by application of the gate voltage to the gate electrode 24 similarly to the case of the oxide semiconductor layer 13 of the first embodiment described above, and, for example, is made of an oxide semiconductor such as the IGZO. A thickness of the oxide semiconductor layer 21, for example, is in the range of 20 to 100 nm.

The gate insulating film 22, for example, is either a single layer film composed of one kind of film selected from a silicon oxide ($SiO_2$) film, a silicon nitride (SiN) film, and a silicon oxynitride (SiON) film, or a lamination film composed of two or more kinds of films selected from a silicon oxide ($SiO_2$) film, a silicon nitride (SiN) film, and a silicon oxynitride (SiON) film. In addition, in the second embodiment, the gate insulating film 22 plays a role as well of storing oxygen in the manufacturing processes. A thickness of the gate insulating film 22, for example, is in the range of 100 to 300 nm.

The protective film 23 is made of an aluminum oxide ($Al_2O_3$) and functions as a protective film (passivation film) for the oxide semiconductor layer 21 similarly to the case of the first protective film 16 of the first embodiment described above. Specifically, the protective film 23 suppresses the commingling of an outside air (such as hydrogen) with the oxide semiconductor layer 21 (especially, the channel 21C). The protective film 23 also has a function of storing oxygen atoms, and supplying the oxygen atoms to the oxide semiconductor layer 21 in manufacturing processes. A thickness of the protective film 23, for example, is in the range of 20 to 100 nm.

In the second embodiment, the protective film 23 functions as the gate insulating film as well. Since the protective film 23 has a large permittivity, it is possible to increase an electric field effect of the transistor. In this case, the protective film 23 shows a higher insulating performance and a higher withstand voltage property than those of a silicon series insulating film. In addition, such a protective film 23 is laminated on the gate insulating film 22, that is, the multilayer film having the two or more layers is provided between the oxide semiconductor layer 21 and the gate electrode 24, which results in that a failure due to contact between the channel 21C of the oxide semiconductor layer 21, and the gate electrode 24 becomes easy to reduce.

The gate electrode 24 has a function of controlling a density of carriers in the oxide semiconductor layer 21 in accordance with a gate voltage (Vg) applied to the TFT 2, and also has a function as a wiring through which a predetermined electric potential is supplied.

However, in the second embodiment, the gate electrode 24 is made of aluminum, and was deposited by utilizing a predetermined sputtering method so as to follow the deposition of the protective film 23. That is to say, although details will be described later, the TFT 2 of the second embodiment has the lamination film having the $Al_2O_3$ layer as the protective film 23, and the Al layer as the gate electrode 24 in this order on the gate insulating film 22. In other words, in the second embodiment, similarly to the case of the first embodiment described above, for the purpose of reducing the change in the film quality of the $Al_2O_3$ layer, the Al layer is continuously deposited on the $Al_2O_3$ layer. After that, however, unlike the case of the first embodiment described above, the Al layer is not removed, but is utilized as the gate electrode 24.

The interlayer insulating film 25, for example, is made of polyimide (PI), and a thickness thereof, for example, is in the range of 500 to 3,000 nm.

The source/drain electrode 26 is separated into two parts in an area corresponding to the channel 21C of the oxide semiconductor layer 21 similarly to the case of the source/drain electrode 15 of the first embodiment. One of the two parts functions as a source electrode, and the other thereof functions as a drain electrode. The metals or the transparent conductive films which are identical to those enumerated in the gate electrode 24 described above are given as a material composing the source/drain electrode 26.

[Method of Manufacturing TFT 2]

FIGS. 8A to 8G are respectively cross sectional views explaining a method of manufacturing the TFT 2. The TFT 2, for example, can be manufacturing as follows.

Figure 8A:
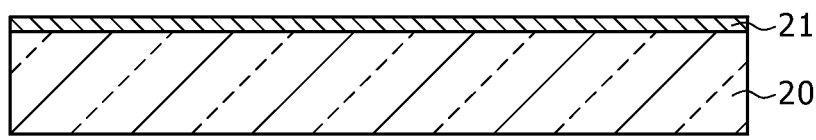
FIGS. 8A to 8G are respectively cross sectional views showing process for manufacturing the TFT shown in FIG. 7.
Figure 8B:
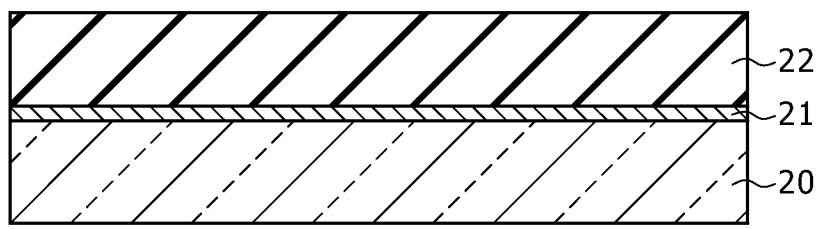

Firstly, as shown in FIG. 8A, the oxide semiconductor layer 21 is deposited on the substrate 20. Subsequently, as shown in FIG. 8B, the gate insulating film 22 is deposited on the oxide semiconductor layer 21 by, for example, utilizing the CVD method.

(Lamination Film Forming Process)

Figure 8C:
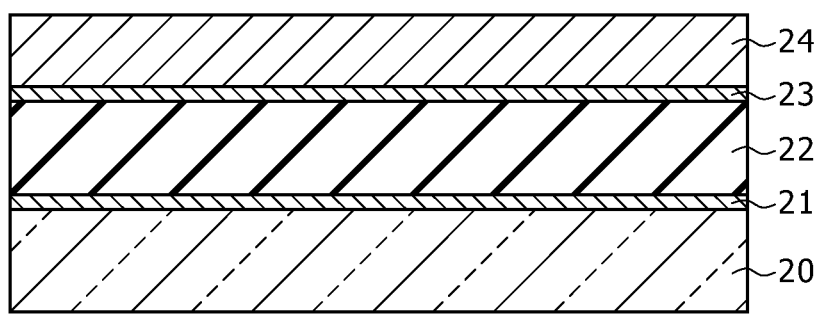

Subsequently, as shown in FIG. 8C, the protective film 23 ($Al_2O_3$ layer) and the gate electrode 24 (Al layer) are formed on the same manner as that in the lamination film forming process described in the first embodiment described above. That is to say, firstly, the protective film 23 ($Al_2O_3$ layer) and the gate electrode 24 (Al layer) are continuously deposited over the entire surface of the substrate 20 by utilizing the sputtering method. In this case, in a first stage step of depositing the $Al_2O_3$ layer, and in a second stage step of depositing the Al layer, the sputtering is carried out while the substrate 20 is held within the same chamber. However, the same aluminum is used as the target and an atmospheric ambient gas is adjusted every step.

Specifically, in the first stage step of depositing the $Al_2O_3$ layer, aluminum as the target, and the substrate 20 as the substrate on which the films are to be deposited are disposed within the chamber so as to face each other, and the sputtering is carried out while an oxygen gas is supplied together with an argon gas to the chamber. At this time, a mass of oxygen atoms are stored in the $Al_2O_3$ layer. Subsequently, in the second stage step of depositing the Al layer, an atmospheric ambient within the chamber is adjusted to an argon gas alone, while the aluminum target is continuously used as it is. Under this condition, the sputtering is carried out. The lamination film of the $Al_2O_3$ layer and the Al layer is formed by carrying out such sputtering.

Here, in the second embodiment, in the step of depositing the $Al_2O_3$ layer described above, the oxygen atoms are stored in the gate insulating film 22 as well underlying the $Al_2O_3$ layer. The oxygen atoms stored in the gate insulating film 22 are supplied together with the oxygen atoms stored in the protective film 23 to the oxide semiconductor layer 21 in the subsequent annealing process.

In addition, in the second embodiment, unlike the case of the first embodiment described above, the Al layer in the lamination film is not removed, but is utilized as the gate electrode 24. That is to say, the Al layer can be utilized as the gate electrode while the change in the film quality of the protective film is suppressed by modifying the surface of the target through the lamination film forming process. Also, the $Al_2O_3$ layer and the Al layer can be continuously deposited within the same sputtering system by using the same aluminum target.

Figure 8D:
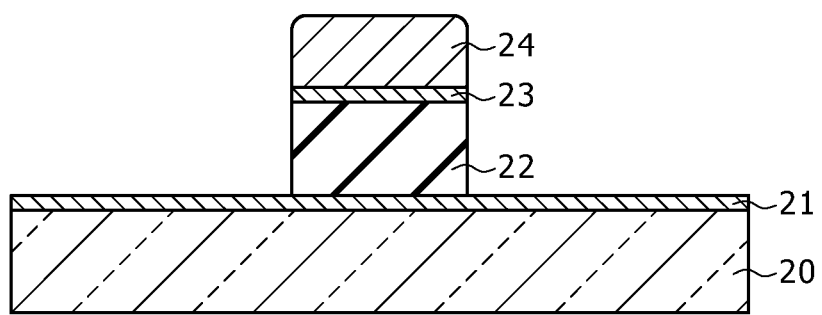

After that, as shown in FIG. 8D, the gate insulating film 22, the protective film 23, and the gate electrode 24 which have been deposited are each patterned into a predetermined shape by, for example, utilizing the dry etching using the photolithography method. As a result, the gate insulating film 22, the protective film 23, and the gate electrode 24 are laminated right above the area becoming the channel 21C in the oxide semiconductor layer 21.

Figure 8E:
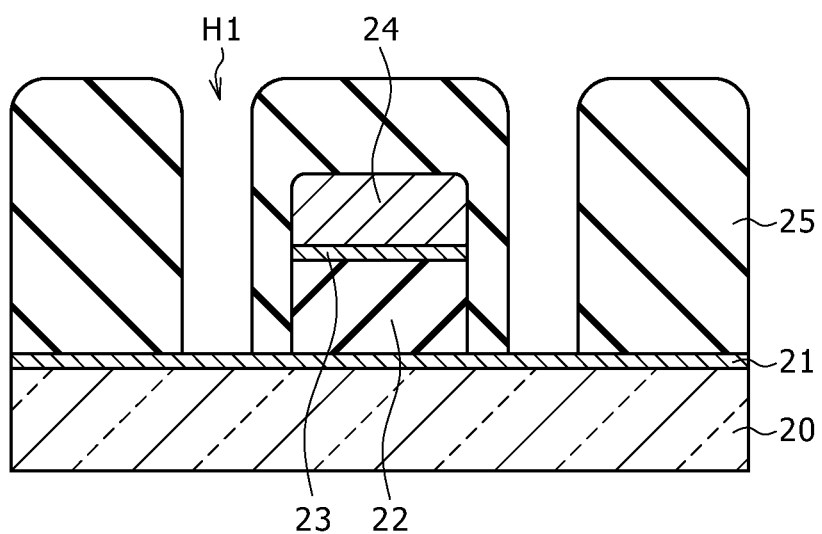

Next, as shown in FIG. 8E, the interlayer insulating film 25 is deposited over the entire surface of the substrate 20, and is then patterned into a predetermined shape by, for example, utilizing the photolithography method. Also, the contact hole H1 is formed so as to extend to the surface of the oxide semiconductor layer 21.

Figure 8F:
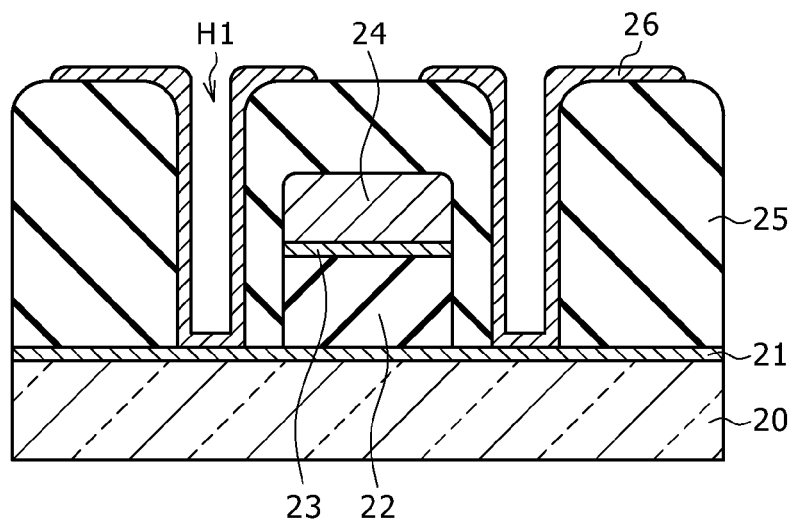

Subsequently, as shown in FIG. 8F, the layer becoming the source/drain electrode 26 is deposited on the interlayer insulating film 25 by, for example, utilizing the sputtering method, and is then patterned into a predetermined shape of the source/drain electrode 26 by, for example, utilizing the wet etching method using the photolithography method. In this case, the source/drain electrode 26 is formed so as to be filled in the contact hole H1 provided in the interlayer insulating film 25, thereby ensuring the electrical connection to the oxide semiconductor layer 21.

Figure 8G:
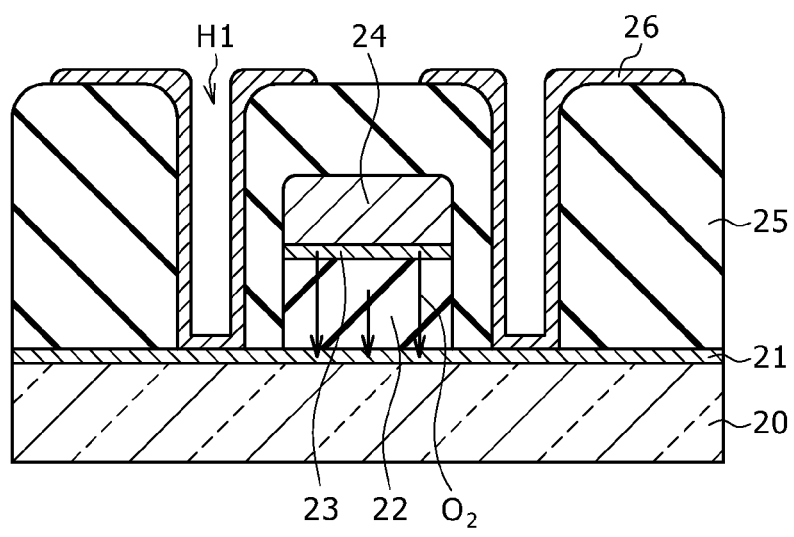

Finally, as shown in FIG. 8G, an annealing treatment is carried out for the entire substrate 20. In this case, the annealing treatment, for example, is carried out at a temperature of 200 to 300° C. for about 0.5 to about two hours in the same atmospheric ambient as that in the first embodiment described above. As a result, the oxygen atoms stored in both of the first protective film 23 and the gate insulating film 22 are supplied to the oxide semiconductor layer 21, thereby realizing the recovery and deterioration prevention of the characteristics in the oxide semiconductor layer 21. With that, the TFT 2 shown in FIG. 7 is completed.

[Operation and Effects of TFT 2]

As described above, in the second embodiment, the processes for manufacturing the TFT 2 include the lamination film forming process for continuously depositing the $Al_2O_3$ layer as the protective film 23 and the Al layer as the gate electrode 24 on the gate insulating film 22 by utilizing the sputtering method. Here, in the process for depositing the $Al_2O_3$ layer, as described in the above first embodiment, the surface of the target is easy to metamorphose due to the oxygen gas used in the reaction. After that, however, the Al layer is continuously deposited (the sputtering not using oxygen is carried out), thereby modifying the surface of the target. That is to say, by carrying out the continuous deposition as described above, even when the number of times of the deposition processing is increased, the surface of the target is modified whenever the deposition processing is carried out. As a result, the thickness and the film quality (such as the density and the refractive index) in the $Al_2O_3$ layer are hard to change. Therefore, the reproducibility of the film quality of the $Al_2O_3$ layer is enhanced, and thus the protective film can be stably formed.

In particular, in the second embodiment, after completion of the lamination film forming process as described above, the Al layer is not removed, but is utilized as the gate electrode 24. That is to say, in the lamination film forming process, the gate electrode 24 can be continuously deposited within the same sputtering system as that for the protective film 23 by using the same target. For this reason, the protective film 23 can be stably deposited (while the change in the film quality is suppressed), and also the manufacturing processes are simplified.

Here, in the transistor having the general top gate structure, the gate electrode is provided on the oxide semiconductor layer with the gate insulating film interposed therebetween. Therefore, a path of oxygen introduction to the oxide semiconductor layer is cut off, and thus the oxygen supply to the oxide semiconductor layer is not sufficiently carried out. For this reason, the techniques unaccompanied by the productivity needed to be used: the annealing treatment which was carried out at a high temperature for a long time in the oxygen ambient; and use of equipment by which the annealing could be carried out in a high-concentration oxygen ambient (large change in system construction). Thus, these techniques were not efficient. On the other hand, in the second embodiment, the protective film 23 which can store and supply oxygen as described above is provided on the inner side (on the oxide semiconductor layer 21 side) relative to the gate electrode 24. Therefore, the annealing treatment is carried out at a temperature of about 200 to about 300° C., which results in that the oxygen introduction path can be readily ensured. Therefore, in the transistor having the top gate structure like the second embodiment, the supply of oxygen to the oxide semiconductor layer can be more efficiently carried out than that in the related art and thus the productivity is enhanced.

As has been described so far, in the second embodiment, the $Al_2O_3$ layer (the protective film 23) and the Al layer (the gate electrode 24) are continuously deposited in this order on the gate insulating film 22 by utilizing the sputtering method. As a result, the surface of the target which has been metamorphosed in the process for depositing the $Al_2O_3$ layer can be modified in the subsequent process for depositing the Al layer. Therefore, even when the number of times of the deposition processing is increased, it is possible to suppress the change in the thickness, and the change in the film quality in the protective film. Therefore, it is possible to obtain the same effects as those in the first embodiment.

It is noted that when the TFT 2 of the second embodiment, for example, is formed as a drive element in an organic EL display device, it is only necessary that after the TFT 2 is formed on the substrate 20 as a driving substrate through the manufacturing processes described above, the following processes are further carried out. That is to say, although an illustration is omitted here, after the source/drain electrode 26 is formed, a planarizing film, for example, made of polyimide is formed over the entire surface of the substrate 20, and a contact hole is formed in the planarizing film so as to extend to a surface of the source/drain electrode 26. An anode electrode, for example, made of an AlNd alloy is formed so as to be fitted in the contact hole. After that, an inter-pixel insulating film having an opening so as to correspond to the anode electrode is deposited, and an organic layer having a light emission layer is formed in the opening portion. After formation of the organic layer, a cathode electrode is formed, and an encapsulating substrate having a color filter and the like formed thereon is stuck to the cathode electrode through an adhesive layer. As a result, the organic EL display device can be manufactured.

3. Third Embodiment

Structure of TFT 3

Figure 9:
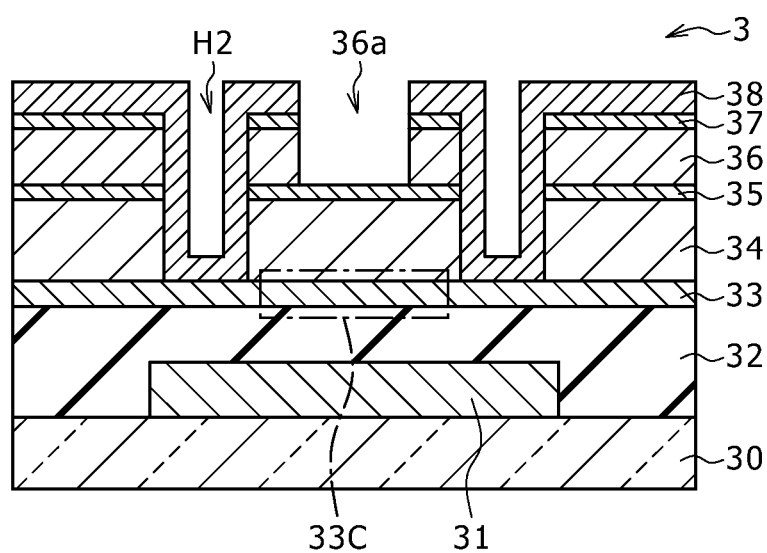
FIG. 9 is a cross sectional view showing a cross sectional structure of a TFT according to a third embodiment.

FIG. 9 shows a cross sectional structure of a TFT (TFT 3) according to a third embodiment. The TFT 3, for example, is used as the drive element of the active matrix type organic EL display or the like similarly to the case of the TFTs 1 and 2 of the first and second embodiments described above. In addition, similarly to the case of the TFT 1, the TFT 3 has the bottom gate structure. Also, the TFT 3 is structured in such a way that a gate electrode and an oxide semiconductor layer are disposed with a gate insulating film interposed therebetween so as to face each other, and a source/drain electrode is provided so as to be electrically connected to the oxide semiconductor layer. In addition, the TFT 3 has a protective film 35 which is formed through the lamination film forming process. In the third embodiment, however, the TFT 3 has a structure that the Al layer in the lamination film remains similarly to the case of the second embodiment.

Specifically, the TFT 3 of the third embodiment includes a gate electrode 31 in a selective area on a substrate 30, for example, made of a glass, and has a gate insulating film 32 over the entire surface of the substrate 30 so as to cover the gate electrode 31. An oxide semiconductor layer 33 is formed on the gate insulating film 32. A stopper layer 34, the protective film 35 (made of $Al_2O_3$), and a wiring layer 36 (made of Al) are laminated in this order on the oxide semiconductor layer 33. A protective metal 37 is formed on the wiring layer 36. A contact hole H2 is formed in the stopper layer 34, the protective film 35, the wiring layer 36, and the protective metal 37 so as to extend to a surface of the oxide semiconductor layer 33. A source/drain electrode 38 is formed on the protective metal 37 so as to be filled in the contact hole H2.

The gate electrode 31 has a function of controlling a density of carriers in the oxide semiconductor layer 33 in accordance with a gate voltage (Vg) applied to the TFT 3, and also has a function as a wiring through which a predetermined electric potential is supplied. The gate electrode 31 is made of the same material or transparent conductive film as that of the gate electrode 11 in the first embodiment described above.

The gate insulating film 32, for example, is either a single layer film composed of one kind of film selected from a silicon oxide film, a silicon nitride film, and a silicon oxynitride film, or a lamination film composed of two or more kinds of films selected from a silicon oxide film, a silicon nitride film, and a silicon oxynitride film.

The oxide semiconductor layer 33 forms the channel 33C by application of the gate voltage to the gate electrode 31 similarly to the case of the oxide semiconductor layer 13 of the first embodiment described above and, for example, is made of an oxide semiconductor such as the IGZO. A thickness of the oxide semiconductor layer 33, for example, is in the range of 20 to 100 nm.

The stopper layer 34, for example, is either a single layer film composed of one kind of film selected from a silicon oxide film, a silicon nitride film, and a silicon oxynitride film, or a lamination film composed of two or more kinds of films selected from a silicon oxide film, a silicon nitride film, and a silicon oxynitride film similarly to the case of the stopper layer 14 in the first embodiment described above. The stopper layer 34 also has a function of preventing the mechanical damage of the channel 33C in the oxide semiconductor layer 33. The stopper layer 34 plays a role as well of storing oxygen in the manufacturing processes.

The protective film 35 is made of an aluminum oxide ($Al_2O_3$), and functions as a protective film (passivation film) for the oxide semiconductor layer 33 similarly to the case of the first protective film 16 in the first embodiment described above. Specifically, the protective film 35 suppresses the commingling of an outside air (such as hydrogen) with the oxide semiconductor layer 33. The protective film 35 also has a function of storing oxygen atoms, and supplying the oxygen atoms to the oxide semiconductor layer 33 in manufacturing processes. A thickness of the protective film 35, for example, is in the range of 20 to 100 nm.

The wiring layer 36 functions as a wiring layer for the source/drain electrode 38, and is made of aluminum. The wiring layer 36 is deposited by utilizing a predetermined sputtering method so as to follow the deposition of the protective film 35 described above. That is to say, although details will be described later, the TFT 3 of the third embodiment has a lamination film having the $Al_2O_3$ layer as the protective film 35, and an Al layer as the wiring layer 36 in this order on the oxide semiconductor layer 33. However, the wiring layer 36 has an opening 36a in an area corresponding to a channel 33C of the oxide semiconductor layer 33. In other words, in the third embodiment, similarly to the case of each of the first and second embodiments described above, the $Al_2O_3$ layer and the Al layer are continuously deposited. After that, however, the entire Al layer is not removed (a part of the Al layer is removed), but a part of the Al layer is left, and the Al layer thus left is utilized as the wiring layer 36.

The protective metal 37, for example, is made of molybdenum, titanium (Ti), or a titanium nitride (TiN), and has a function of protecting the surface of the Al layer as the wiring layer 36.

The source/drain electrode 38 is separated into two parts in an area corresponding to the channel 33C of the oxide semiconductor layer 33 similarly to the case of the source/drain electrode 15 in the first embodiment described above. One of the two parts functions as a source electrode, and the other thereof functions as a drain electrode. The metals or the transparent conductive films which are identical to those enumerated in the gate electrode 11 described above are given as a material composing the source/drain electrode 38.

[Method of Manufacturing TFT 3]

FIGS. 10A to 10G are respectively cross sectional views explaining a method of manufacturing the TFT 3. The TFT 3, for example, can be manufactured as follows.

Figure 10A:
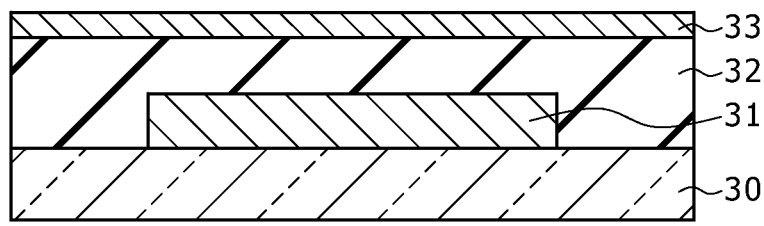
FIGS. 10A to 10G are respectively cross sectional views showing process for manufacturing the TFT shown in FIG. 9.
Figure 10B:
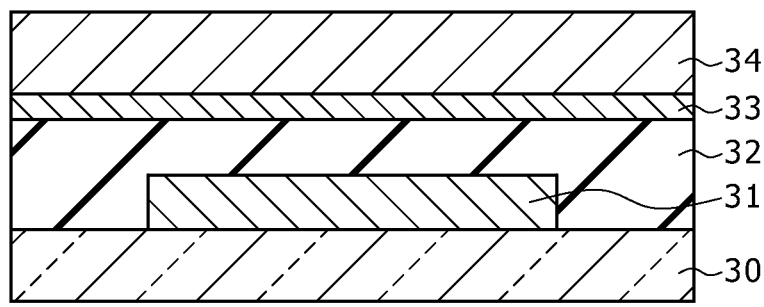

Firstly, similarly to the case of the first embodiment described above, the gate electrode 31, the gate insulating film 32, and the oxide semiconductor layer 33 are deposited in this order on the substrate 30 (refer to FIG. 10A). Subsequently, as shown in FIG. 10B, the stopper layer 34 is deposited on the oxide semiconductor layer 33 by, for example, utilizing the CVD method.

(Lamination Film Forming Process)

Figure 10C:
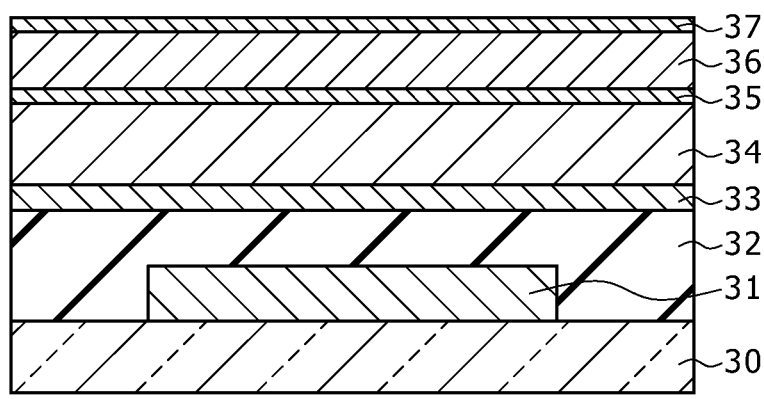

Subsequently, as shown in FIG. 10C, the protective film 35 ($Al_2O_3$ layer) and the gate electrode 36 (Al layer) are formed on the stopper layer 34 in the same manner as that in the lamination film forming process described in the first embodiment described above. That is to say, firstly, the protective film 35 ($Al_2O_3$ layer) and the wiring layer 36 (Al layer) are continuously deposited over the entire surface of the substrate 30 by utilizing the sputtering method. In this case, in a first stage step of depositing the $Al_2O_3$ layer, and in a second stage step of depositing the Al layer, the sputtering is carried out while the substrate 30 is held within the same chamber. However, the same aluminum is used as the target and an atmospheric ambient gas is adjusted every step.

Specifically, in the first stage step of depositing the $Al_2O_3$ layer, aluminum as the target, and the substrate 30 as the substrate on which the films are to be deposited are disposed within the chamber so as to face each other, and the sputtering is carried out while an oxygen gas is supplied together with an argon gas to the chamber. At this time, a mass of oxygen atoms are stored in the $Al_2O_3$ layer. Subsequently, in the second stage step of depositing the Al layer, an atmospheric ambient within the chamber is adjusted to an argon gas alone, while the aluminum target is continuously used as it is. Under this condition, the sputtering is carried out. The lamination film of the $Al_2O_3$ layer and the Al layer is formed by carrying out such sputtering. After that, the protective metal 37 is deposited over the entire surface of the wiring layer 36 by, for example, utilizing the sputtering method.

Here, in the third embodiment, in the step of depositing the $Al_2O_3$ layer described above, the oxygen atoms are stored in the stopper layer 34 as well underlying the $Al_2O_3$ layer. The oxygen atoms stored in the stopper layer 34 are supplied together with the oxygen atoms stored in the protective film 35 to the oxide semiconductor layer 33 in the subsequent annealing process.

In addition, in the third embodiment, the entire Al layer in the lamination film is not removed, but the remaining Al layer is utilized as the wiring layer 36. That is to say, the Al layer can be utilized as the wiring layer 36 while the change in the film quality of the protective film is suppressed by modifying the surface of the target through the lamination film forming process. Also, the $Al_2O_3$ layer and the Al layer can be continuously deposited within the same sputtering system by using the same target.

Figure 10D:
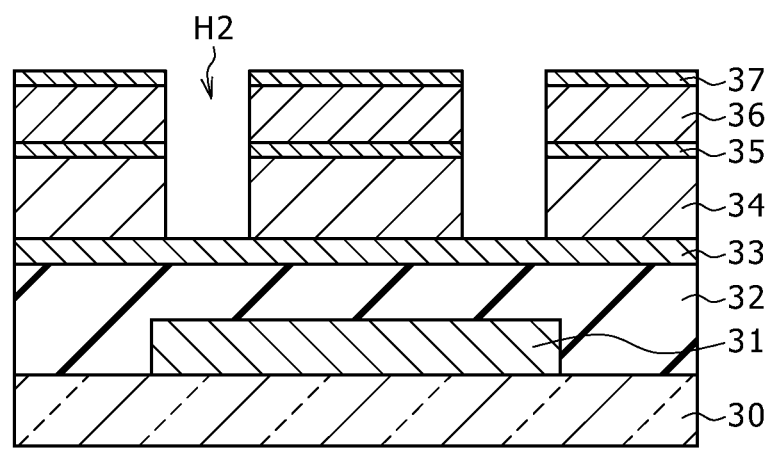

Next, as shown in FIG. 10D, parts of the stopper layer 34, the protective film 35, the wiring layer 36, and the protective metal 37 are collectively removed away to the surface of the oxide semiconductor layer 33 by, for example, utilizing the dry etching method using the photolithography method, thereby forming the contact hole H2.

Figure 10E:
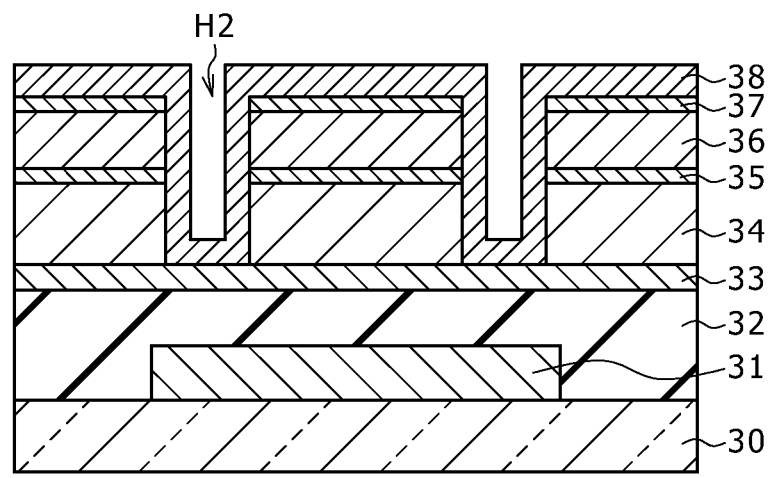

Subsequently, as shown in FIG. 10E, the layer becoming the source/drain electrode 38 is deposited on the protective metal 37 by, for example, utilizing the sputtering method, and is then patterned into the predetermined shape of the source/drain electrode 38 by, for example, utilizing the wet etching method using the photolithography method. In this case, the source/drain electrode 38 is formed so as to be filled in the contact hole H2, thereby ensuring the electrical connection to the oxide semiconductor layer 33.

Figure 10F:
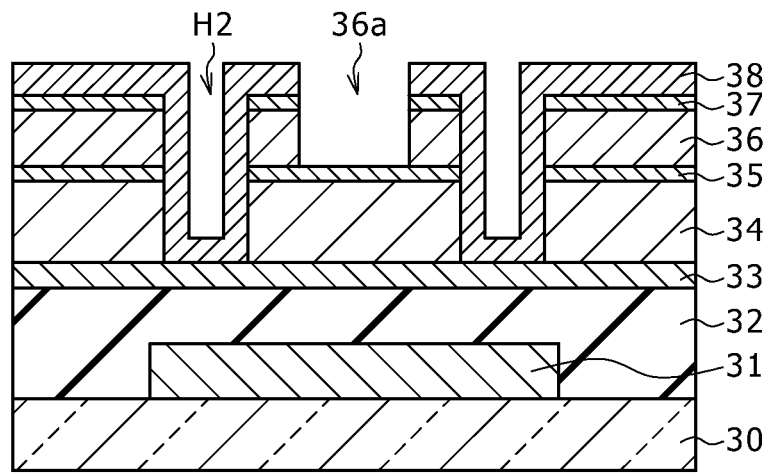

Next, as shown in FIG. 10F, areas of the wiring layer 36, the protective metal 37, and the source/drain electrode 38 corresponding to the channel 33C are collectively removed to the surface of the protective film 35 by, for example, utilizing the wet etching method using the photolithography method. As a result, the opening 36a is formed in the wiring layer 36 in an area right above the channel 33C, and the source/drain electrode 38 is separated (insulated) into two parts.

Figure 10G:
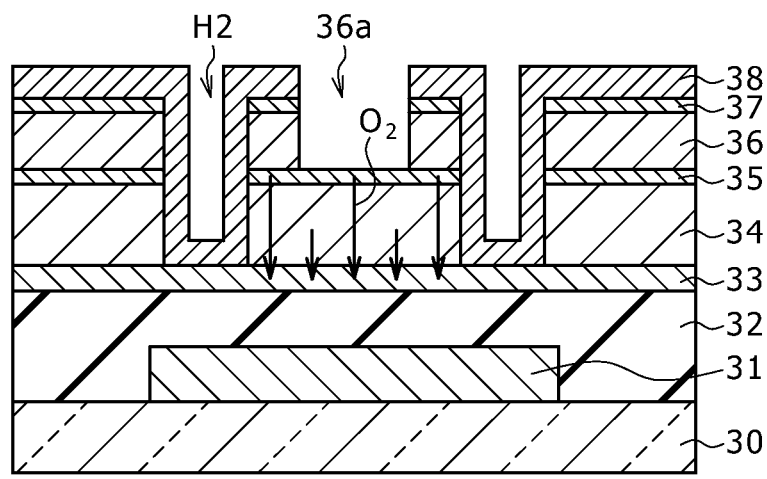

Finally, as shown in FIG. 10G, an annealing treatment is carried out for the entire substrate 30. In this case, the annealing treatment, for example, is carried out at a temperature of 200 to 300° C. for about 0.5 to about two hours in the same atmospheric ambient as that in the first embodiment described above. As a result, the oxygen atoms stored in the protective film 35 and the stopper layer 34 are supplied to the oxide semiconductor layer 33, thereby realizing the recovery and deterioration prevention of the characteristics in the oxide semiconductor layer 33. With that, the TFT 3 shown in FIG. 9 is completed.

[Operation and Effects of TFT 3]

As described above, in the third embodiment, the processes for manufacturing the TFT 3 includes the lamination film forming process for continuously depositing the $Al_2O_3$ layer as the protective film 35 and the Al layer as the wiring layer 36 on the oxide semiconductor layer 33 through the stopper layer 34 by utilizing the sputtering method. Here, in the process for depositing the $Al_2O_3$ layer, as described in the above first embodiment, the surface of the target is easy to metamorphose due to the oxygen gas used in the reaction. After that, however, the Al layer is continuously deposited (the sputtering not using oxygen is carried out), thereby modifying the surface of the target. That is to say, by carrying out the continuous deposition as described above, even when the number of times of the deposition processing is increased, the surface of the target is modified whenever the deposition processing is carried out. As a result, the thickness and the film quality (such as the density and the refractive index) in the $Al_2O_3$ layer are hard to change. Therefore, the reproducibility of the film quality of the $Al_2O_3$ layer is enhanced, and thus the protective film can be stably formed.

In addition, in the third embodiment, after completion of the lamination film forming process as described above, the entire Al layer is not removed, but the remaining Al layer is utilized as the wiring layer 36. That is to say, in the lamination film forming process, the wiring layer 36 can be continuously deposited within the same sputtering system as that for the deposition of the protective film 35 by using the same target.

As has been described so far, in the third embodiment, the $Al_2O_3$ layer (the protective film 23) and the Al layer (the gate electrode 24) are continuously deposited in this order on the oxide semiconductor layer 33 (after the deposition of the stopper layer 34) by utilizing the sputtering method. As a result, the surface of the target which has been metamorphosed in the process of the deposition of the $Al_2O_3$ layer can be modified in the subsequent process of the deposition of the Al layer. Therefore, even when the number of times of the deposition processing is increased, it is possible to suppress the change in the thickness, and the change in the film quality in the protective film. Therefore, it is possible to obtain the same effects as those in the first embodiment.

Structural Example in Driving Substrate

Figure 11:
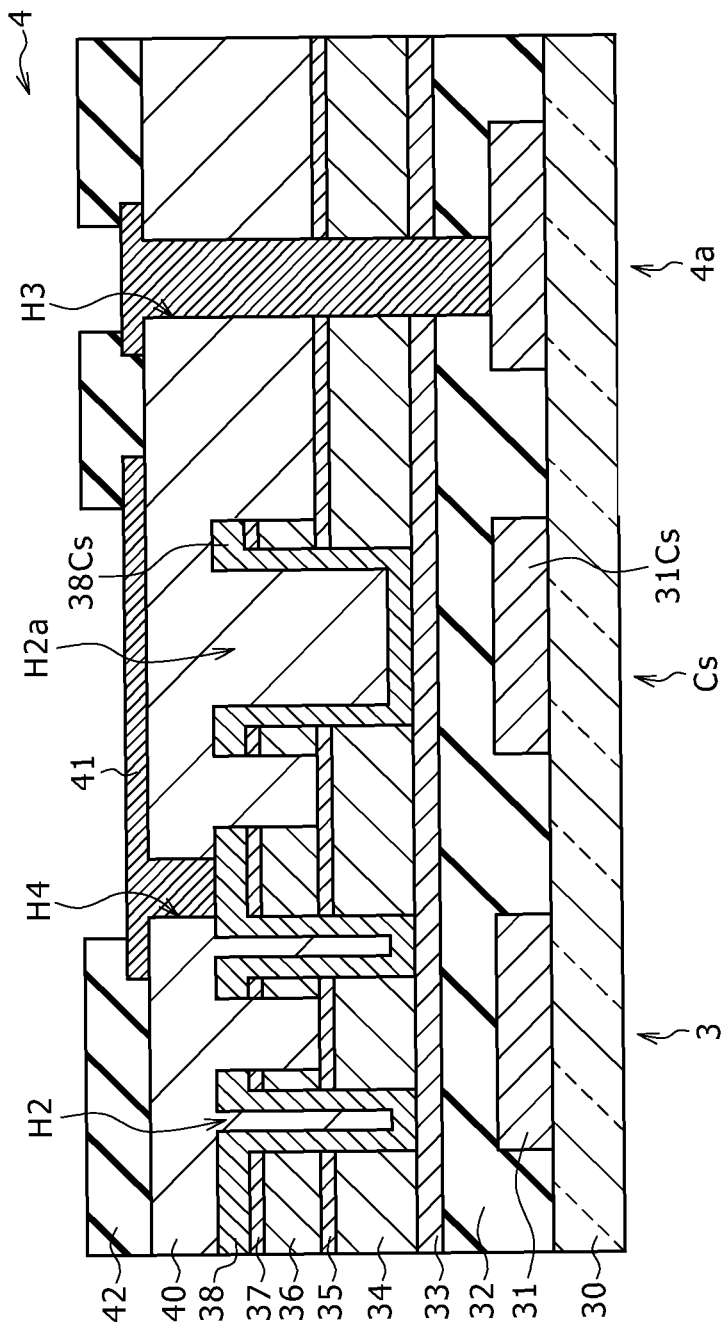
FIG. 11 is a cross sectional view explaining an example of disposition of the thin film transistor shown in FIG. 9 in a driving substrate.

FIG. 11 shows a structural example when the TFT 3 of the third embodiment, for example, is disposed on a driving substrate in an organic EL display device. As shown in FIG. 11, in the driving substrate 4, for example, both of a holding capacitor element Cs and a gate contact portion 4a are provided in the periphery of the TFT 3. The gate electrode 31 is disposed not only in the TFT 3, but also in an area corresponding to the holding capacitor element Cs and the gate contact portion 4a. It is noted that the gate electrode 31 disposed in the area corresponding to the holding capacitor element Cs is shown as a lower electrode 31Cs.

In the holding capacitor element Cs, in the lamination structure which is approximately identical to that of the TFT 3, the stopper layer 34, the protective film 35, the wiring layer 36, and the protective metal 37 are selectively etched away (a contact hole H2a is formed) by utilizing the etching method. An upper electrode 38Cs is provided so as to be filled in the contact hole H2a. The contact hole H2a can be formed in the same process as that of the contact hole H2. Also, the upper electrode 38Cs can be patterned in the same process as that of the source/drain electrode 38.

In a gate contact portion 4a, a contact hole H3 is formed so as to extend completely through the gate insulating film 32, the oxide semiconductor layer 33, the stopper layer 34, the protective film 35, and the planarizing film 40 to reach the surface of the gate electrode 31.

A planarizing film 40, for example, made of polyimide is provided above the substrate 30 so as to cover the TFT 3, the holding capacitor element Cs and the gate contact portion 4a. The planarizing film 40 has a contact hole H4 extending to the surface of the source/drain electrode 38 in the TFT 3.

An anode electrode 41, for example, made of an AlNd alloy is disposed so as to be filled in the contact holes H3 and H4, and an inter-pixel insulating film 42 is provided on the anode electrode 41.

The driving substrate 4 as described above, for example, can be manufactured as follows. That is to say, firstly, the gate electrode 31, the gate insulating film 32, the oxide semiconductor layer 33, and the stopper layer 34 are deposited in this order on the substrate 30 in the manner as described above in the manufacturing process (refer to FIGS. 10A and 10B) of the TFT 3 described above. However, the gate electrode 31 is formed through the pattering so as to be disposed in the areas of the TFT 3, the holding capacitor element Cs, and the gate contact portion 4a. Subsequently, the protective film 35 and the wiring layer 36 are formed on the stopper layer 34 in the lamination film forming process described above in the manner as described with reference to FIG. 10C. In addition, the protective metal 37 is deposited on the wiring layer 36.

After that, parts of the stopper layer 34, the protective film 35, the wiring layer 36, and the protective metal 37 are collectively removed away to the surface of the oxide semiconductor layer 33, thereby forming the contact hole H2 in the manner as described with reference to FIG. 10D. In this case, the contact hole H2a in the holding capacitor element Cs is formed concurrently with the formation of the contact hole H2. Subsequently, the source/drain electrode 38 (the upper electrode 38Cs) is deposited on the protective metal 37 so as to be filled in the contact holes H2 and H2a in the manner as described with reference to FIG. 10E.

Next, areas of the wiring layer 36, the protective metal 37, and the source/drain electrode 38 corresponding to the channel 33C are collectively removed away to the surface of the protective film 35 by, for example, utilizing the wet etching using the photolithography method in the manner described with reference to FIG. 10F. In this case, the patterning in the holding capacitor element Cs and the gate contact portion 4a is also carried out concurrently with the above process.

After that, the planarizing film 40 is deposited, and the contact holes H3 and H4 are both formed in the planarizing film 40. Specifically, the planarizing film 40 is selectively etched away in selective areas of a predetermined area in the TFT 3 (an area corresponding to the source/drain electrode 38), and a predetermined area in the gate contact portion 4a (an area corresponding to the gate electrode 31). As a result, the contact hole H4 is formed in the TFT 3, and the opening (the opening portion of the planarizing film 40 in the contact hole H3) is formed in the gate contact portion 4a. After that, in the gate contact portion 4a, the opening portion described above is further etched away to the lower layer, which results in that the protective film 35, the stopper layer 34, the oxide semiconductor layer 33, and the gate insulating film 32 are selectively etched away to the surface of the gate electrode 31. As a result, the contact hole H3 is formed in the gate contact portion 4a.

The anode electrode 41 is formed so as to be filled in the contact holes H3 and H4 formed in such a way by, for example, utilizing the sputtering method. After that, the inter-pixel insulating film 42 is deposited, and an opening is formed in an area corresponding to the anode electrode 41. It is noted that the subsequent process for manufacturing the organic EL display device are as described in the first embodiment described above. Note that, it is only necessary that the annealing processing described with reference to FIG. 10G is carried out either after formation of the planarizing film 40 or after formation of the inter-pixel insulating film 42.

4. Display Device

Configuration of Display Device and Configuration of Pixel Circuit

Figure 12:
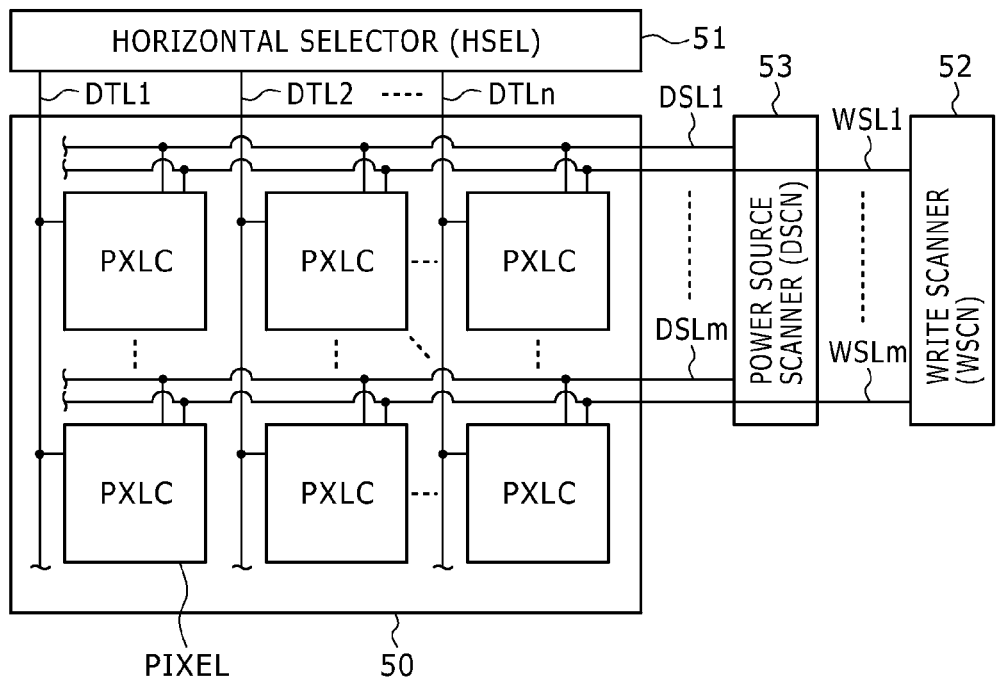
FIG. 12 is a block diagram showing an entire configuration of a display device, including a peripheral circuit, to which any of the first to third embodiments is applied.

Next, a description will be given with respect to an entire configuration of a display device using any of the TFT 1 to TFT 3 according to the first to third embodiments, and a configuration of a pixel circuit composing the display device. FIG. 12 shows the entire configuration of the display device including a peripheral circuit and used as an organic EL display device. A display area 50 in which plural pixels PXLCs each including an organic EL element are disposed in a matrix is formed on the substrate 10 (or the substrate 20, 30) in such a way. A horizontal selector (HSEL) 51 as a signal line drive circuit, a write scanner (WSCN) 52 as a scanning line drive circuit, and a power source scanner (DSCN) 53 as a power source line drive circuit are provided in the periphery of the display area 50.

In the display area 50, plural signal lines DTL1 to DTLn (n: integral number) are disposed in a column direction, and plural sampling lines WSL1 to WSLm (m: integral number) are disposed in a row direction. In addition, a pixel PXLC (one of the pixels corresponding to R, G, and B) is provided in an intersection between each of the signal lines DTLs and each of the scanning lines WSLs. Each of the signal lines DTLs is connected to the horizontal selector 51, and a video signal is supplied from the horizontal selector 51 to each of the signal lines DTLs. Each of the scanning lines WSLs is connected to the write scanner 52, and a scanning signal (selection pulse) is supplied from the write scanner 52 to each of the scanning lines WSLs. Each of the power source lines DSLs is connected to the power source scanner 53, and the power source signal (control pulse) is supplied from the power source scanner 53 to each of the power source lines DSLs.

Figure 13:
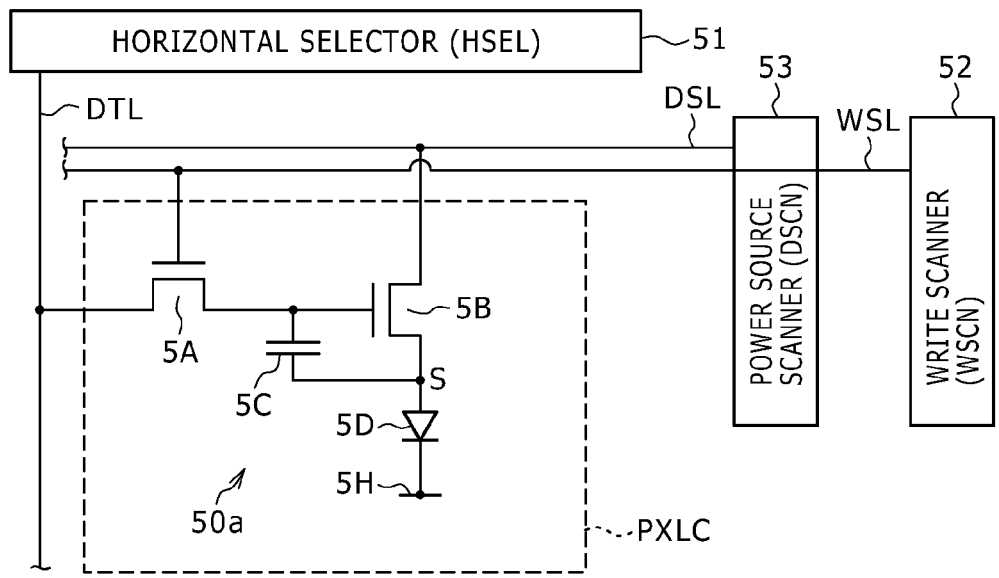
FIG. 13 is a circuit diagram, partly in block, showing a configuration of a pixel circuit shown in FIG. 12.

FIG. 13 shows a concrete example of a circuit configuration of the pixel PXLC. Each of the pixels PXLCs has a pixel circuit 50a including an organic EL element 5D. The pixel circuit 50a is an active type drive circuit having a sampling transistor 5A, a driving transistor 5B, a holding capacitor element 5C, and the organic EL element 5D. Of these constituent elements 5A to 5D, the sampling transistor 5A (or the driving transistor 5B) corresponds to any of the TFT 1 to TFT 3 in the embodiments. Also, the holding capacitor element 5C corresponds to the holding capacitor element Cs described in the third embodiment described above.

A gate terminal of the sampling transistor 5A is connected to corresponding scanning line WSL. Also, one of a source terminal and a drain terminal of the sampling transistor 5A is connected to corresponding signal line DTL, and the other thereof is connected to a gate terminal of the driving transistor 5B. A drain terminal of the driving transistor 5B is connected to corresponding power source line DSL, and a source terminal thereof is connected to an anode terminal of the organic EL element 5D. In addition, a cathode terminal of the organic EL element 5D is connected to a grounding wiring 5H. It is noted that the grounding wiring 5H is wired so as to be common to all of the pixels PXLCs. The holding capacitor element 5C is disposed between the source terminal and gate terminal of the driving transistor 5B.

The sampling transistor 5A is caused to conduct in accordance with the scanning signal (selection pulse) supplied thereto from the scanning line WSL to sample a signal potential of the video signal supplied thereto from the signal line DTL, thereby holding the signal potential in the holding capacitor element 5C. The driving transistor 5B receives supply of a current from the power source line DSL set at a predetermined first potential (not shown), and supplies a drive current to the organic EL element 5D in accordance with the signal potential held in the holding capacitor element 5C. The organic EL element 5D emits a light at a luminance corresponding to the signal potential of the video signal based on the drive current supplied thereto from the driving transistor 5B.

With such a circuit configuration, the sampling transistor 5A is caused to conduct in accordance with the scanning signal (selection pulse) supplied thereto from the scanning line WSL to sample the signal potential of the video signal supplied thereto from the signal line DTL, thereby holding the signal potential in the holding capacitor element 5C. In addition, the current is supplied from the power source line DSL set at the predetermined first potential described above to the driving transistor 5B, and the drive current is supplied to the organic EL element 5D (each of the organic EL elements of Red, Green, and Blue) in accordance with the signal potential held in the holding capacitor element 5C. Also, each of the organic EL elements 5D emits the light at the luminance corresponding to the signal potential of the video signal based on the drive current supplied thereto from the driving transistor 5B. As a result, an image based on the video signal is displayed on the display device.

5. Application Examples

Hereinafter, a description will be given with respect to application examples of electronic apparatuses to which the display device using any of the TFT 1 to TFT 3 as described above is applied. A television set, a digital camera, a notebook-size personal computer, mobile terminal equipment such as a mobile phone, a video camera, or the like, for example, is given as the electronic apparatus. In other words, the display device described above can be applied to the display devices, of electronic apparatuses in all the fields, in each of which a video signal inputted from the outside to the electronic apparatus, or a video signal generated in the electronic apparatus is displayed in the form of an image or a video image.

(Module)

Figure 14:
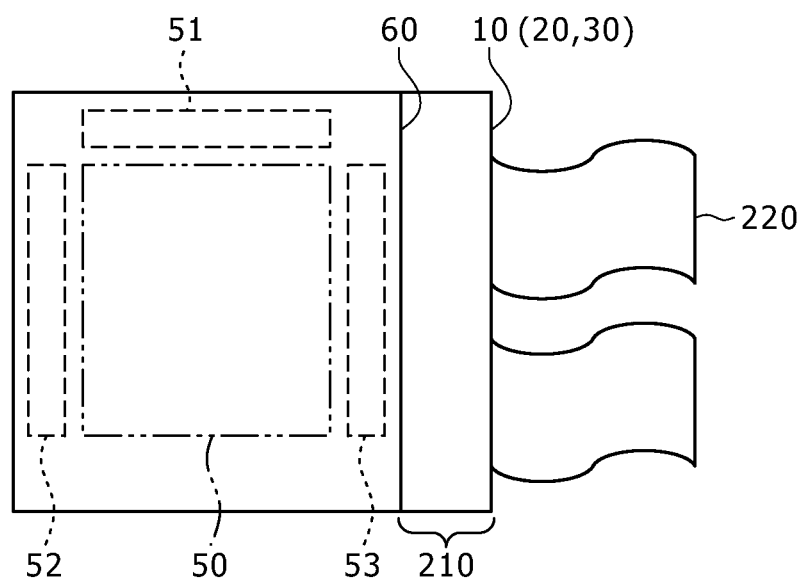
FIG. 14 is a top plan view showing a module-shaped display device in the form of which the display device shown in FIG. 12 is incorporated in various electronic apparatuses.

The display device described above is incorporated as a module, for example, as shown in FIG. 14 in various kinds of electronics apparatuses exemplified as first to fifth examples of application which will be described later. In the module, for example, an area 210 exposed from the encapsulating substrate 60 is provided in one side of the substrate 10 (or the substrate 20, 30), and wirings of the horizontal selector 51, the write scanner 52, and the power source scanner 53 are made to extend to form external connection terminals (not shown) in the exposed area 210. A Flexible Printed Circuit (FPC) board 220 for input/output of the signals may be provided in those external connection terminals.

First Examples of Application

Figure 15:
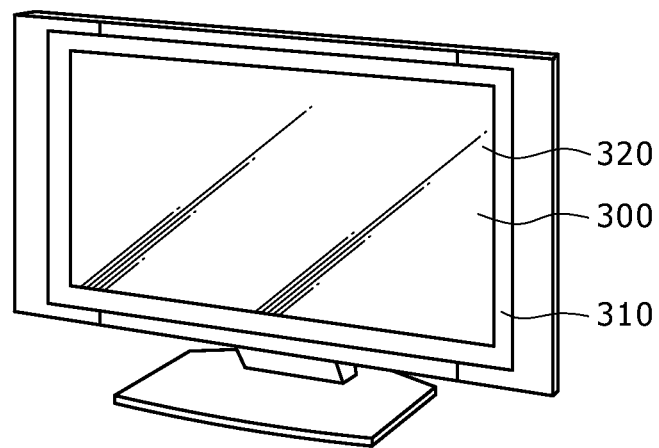
FIG. 15 is a perspective view of a television set as a first example of application to which the display device shown in FIG. 12 is applied.

FIG. 15 is a perspective view showing an external appearance of a television set as a first example of application to which the display device shown in FIG. 12 is applied. The television set, for example, includes an image display screen portion 300 composed of a front panel 310 and a filter glass 320. In this case, the image display screen portion 300 corresponds to the display device shown in FIG. 12.

Second Example of Application

Figure 16A:
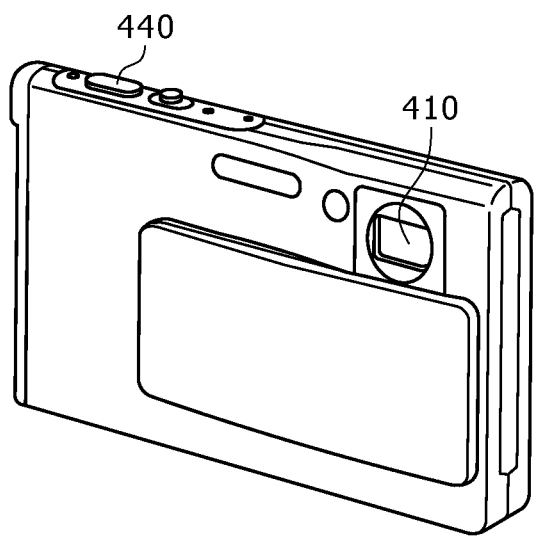
FIGS. 16A and 16B are respectively a perspective view of a digital camera as a second example of application, when viewed from a front side, to which the display device shown in FIG. 12 is applied, and a perspective view of the digital camera as the second example of application, when viewed from a back side, to which the display device shown in FIG. 12 is applied.
Figure 16B:
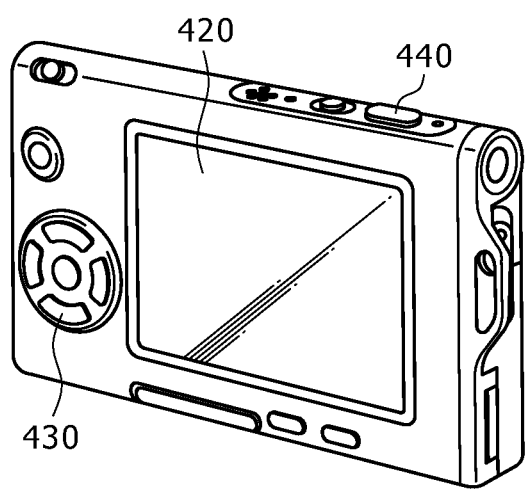

FIGS. 16A and 16B are respectively perspective views showing respective external appearances of a digital camera as a second example of application to which the display device shown in FIG. 12 is applied. The digital camera, for example, includes a light emitting portion 410 for flash, a display portion 420, a menu switch 430, and a shutter button 440. In this case, the display portion 420 corresponds to the display device shown in FIG. 12.

Third Example of Application

Figure 17:
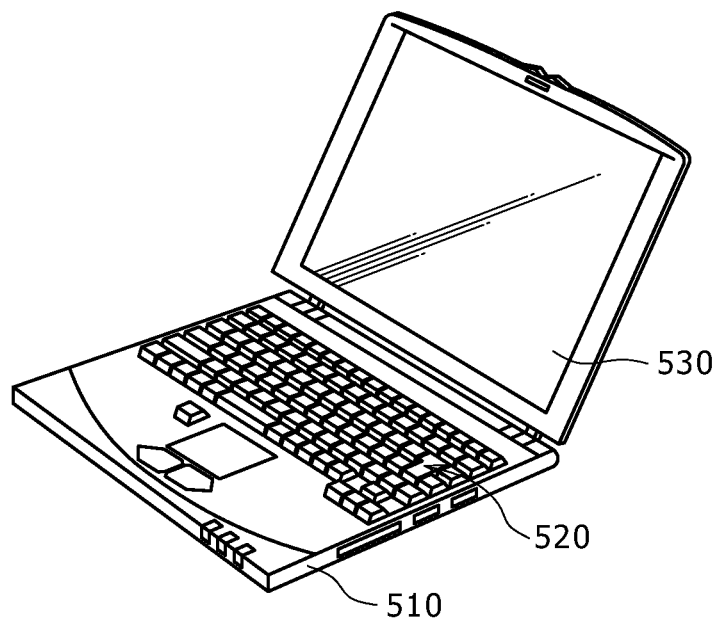
FIG. 17 is a perspective view showing a notebook-size personal computer as a third example of application to which the display device shown in FIG. 12 is applied.

FIG. 17 is a perspective view showing an external appearance of a notebook-size personal computer as a third example of application to which the display device shown in FIG. 12 is applied. The notebook-size personal computer, for example, includes a main body 510, a keyboard 520 which is manipulated when characters or the like are inputted, and a display portion 530 for displaying thereon an image. In this case, the display portion 530 corresponds to the display device shown in FIG. 12.

Fourth Example of Application

Figure 18:
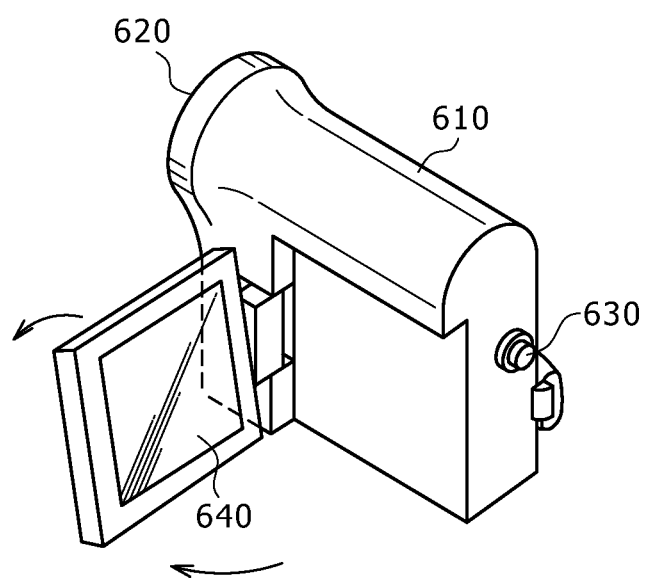
FIG. 18 is a perspective view showing a video camera as a fourth example of application to which the display device shown in FIG. 12 is applied.

FIG. 18 is a perspective view showing an external appearance of a video camera as a fourth example of application to which the display device shown in FIG. 12 is applied. The video camera, for example, includes a main body portion 610, a lens 620 which captures an image of a subject and which is provided on a side surface directed forward, a start/stop switch 630 which is manufactured when an image of a subject is captured, and a display portion 640. In this case, the display portion 640 corresponds to the display device shown in FIG. 12.

Fifth Example of Application

FIGS. 19A to 19G are respectively views showing respective external appearances of a mobile phone as a fifth example of application to which the display device shown in FIG. 12 is applied. The mobile phone, for example, is constructed in such a way that an upper chassis 710 and a lower chassis 720 are coupled to each other through a coupling portion (hinge portion) 730. The mobile phone, for example, includes a display portion 740, a sub-display portion 750, a picture light 760, and a camera 770 in addition to the upper chassis 710, the lower chassis 720, and the coupling portion (hinge portion) 730. In this case, of these constituent elements, either the display portion 740 or the sub-display portion 750 corresponds to the display device shown in FIG. 12.

Although the present disclosure has been described so far by giving the embodiments, the present disclosure is by no means limited thereto, and various kinds of changes can be made. For example, although in the embodiments described above, the TFT having the bottom gate structure is described by exemplifying the structure having the stopper layer, the stopper layer may not be necessarily provided.

In addition, the present disclosure is by no means limited to the structures described in the above embodiments, respectively, and thus the present disclosure can be applied to TFTs having various structures, respectively, as long as the protective film of the oxide semiconductor layer is formed through the process for forming the lamination film of the $Al_2O_3$ layer and the Al layer. In addition, the materials and thicknesses of the layers, and the manufacturing processes and the like are by no means limited to those described above.

It should be understood that various changes and modifications to the presently preferred embodiments described herein will be apparent to those skilled in the art. Such changes and modifications can be made without departing from the spirit and scope and without diminishing its intended advantages. It is therefore intended that such changes and modifications be covered by the appended claims.

The application is claimed as follows:

1. A method of manufacturing a thin film transistor having a gate insulating film interposed between a gate electrode and an oxide semiconductor layer, and a source/drain electrode layer electrically connected to the oxide semiconductor layer, the method comprising:
    forming the gate electrode on a substrate;
    forming the oxide semiconductor layer on the gate insulating film;
    forming the source/drain electrode layer on the oxide semiconductor layer;
    after forming the source/drain electrode layer, forming a protective film, utilizing a sputtering method, on one or more of the source/drain electrode layer, the gate insulating film, and the oxide semiconductor layer, wherein the protective film is formed by continuously depositing an aluminum oxide layer on the one or more of the source/drain electrode layer, the gate insulating film, and the oxide semiconductor layer, and continuously depositing an aluminum layer on the aluminum oxide layer and selectively removing at least a portion of the aluminum layer.

2. The method of manufacturing the thin film transistor according to claim 1, wherein after the aluminum deposited on the aluminum oxide layer is selectively removed, another oxide aluminum layer having a lower oxygen concentration than that of the aluminum oxide layer remains on the aluminum oxide layer.

3. The method of manufacturing the thin film transistor according to claim 1, wherein
    the sputtering method is performed in an ambient containing therein oxygen by using aluminum as a target material when the oxide aluminum layer is deposited; and the sputtering is performed in an ambient containing therein no oxygen by using the target material used in depositing the aluminum oxide layer when the aluminum layer is deposited.

4. A method of manufacturing a thin film transistor having a gate insulating film interposed between a gate electrode and an oxide semiconductor layer, and a source/drain electrode layer electrically connected to the oxide semiconductor layer, the method comprising:

forming a protective film, utilizing a sputtering method, on one or more of the source/drain electrode layer, the gate insulating film, and the oxide semiconductor layer, wherein the protective film is formed by continuously depositing an aluminum oxide layer on the one or more of the source/drain electrode layer, the gate insulating film, and the oxide semiconductor layer, and continuously depositing an aluminum layer on the aluminum oxide layer, wherein the sputtering method is performed in an ambient containing therein oxygen by using aluminum as a target material when the aluminum oxide layer is deposited, and the sputtering method is performed in an ambient containing therein no oxygen by using the target material used in depositing the aluminum oxide layer when the aluminum layer is deposited.

5. The method of manufacturing the thin film transistor according to claim 4, further comprising:

selectively removing at least a portion of the aluminum layer.

6. The method of manufacturing the thin film transistor according to claim 4, further comprising removing at least a portion of the aluminum layer deposited on the aluminum oxide layer.

7. The method of manufacturing the thin film transistor according to claim 4, wherein after a portion of the aluminum deposited on the aluminum oxide layer is removed, another oxide aluminum layer having a lower oxygen concentration than that of the aluminum oxide layer remains on the aluminum oxide layer.

8. A method of manufacturing a thin film transistor having a gate insulating film between a gate electrode and an oxide semiconductor layer, and a source/drain electrode layer electrically connected to the oxide semiconductor layer, the method comprising:

forming the oxide semiconductor layer on a substrate;

forming the gate insulating film on at least a portion of the oxide semiconductor layer;

after forming the gate insulating film, forming a protective film, utilizing a sputtering method, on one or more of the gate insulating film and the oxide semiconductor layer, wherein the protective film is formed by continuously depositing an aluminum oxide layer on the one or more of the gate insulating film and the oxide semiconductor layer, and continuously depositing an aluminum layer on the aluminum oxide layer, wherein the sputtering method is performed in an ambient containing therein oxygen by using aluminum as a target material when the aluminum oxide layer is deposited, and the sputtering method is performed in an ambient containing therein no oxygen by using the target material used in depositing the aluminum oxide layer when the aluminum layer is deposited;

forming an interlayer insulating film on the aluminum layer; and forming the source/drain electrode on the interlayer insulating film.

* * * * *